(12) United States Patent
Chen et al.

(10) Patent No.: US 11,469,203 B2
(45) Date of Patent: Oct. 11, 2022

(54) METHOD FOR FORMING PACKAGE STRUCTURE WITH A BARRIER LAYER

(71) Applicant: Taiwan Semiconductor Manufacturing Company, Ltd., Hsinchu (TW)

(72) Inventors: Cheng-Hung Chen, Tainan (TW); Yu-Nu Hsu, Tainan (TW); Chun-Chen Liu, Kaohsiung (TW); Heng-Chi Huang, Zhudong Township, Hsinchu County (TW); Chien-Chen Li, Hsinchu (TW); Shih-Yen Chen, Hsinchu (TW); Cheng-Nan Hsieh, Chubei (TW); Kuo-Chio Liu, Hsinchu (TW); Chen-Shien Chen, Zhubei (TW); Chin-Yu Ku, Hsinchu (TW); Te-Hsun Pang, Tainan (TW); Yuan-Feng Wu, Tainan (TW); Sen-Chi Chiang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 62 days.

(21) Appl. No.: 17/072,798

(22) Filed: Oct. 16, 2020

(65) Prior Publication Data

US 2021/0035937 A1 Feb. 4, 2021

Related U.S. Application Data

(62) Division of application No. 16/194,927, filed on Nov. 19, 2018, now Pat. No. 10,811,377.

(Continued)

(51) Int. Cl.
*H01L 23/00* (2006.01)
*H01L 23/498* (2006.01)

(52) U.S. Cl.
CPC ........ *H01L 24/13* (2013.01); *H01L 23/49827* (2013.01); *H01L 24/03* (2013.01);
(Continued)

(58) Field of Classification Search
CPC ........ H01L 24/03–81; H01L 2224/81–81986; H01L 2021/60022–60262;
(Continued)

(56) References Cited

U.S. PATENT DOCUMENTS 8,803,337 B1    8/2014   Lin et al.
8,993,380 B2    3/2015   Hou et al.
(Continued)

FOREIGN PATENT DOCUMENTS

CN            102157473 A      8/2011

*Primary Examiner* — Sonya McCall-Shepard
(74) *Attorney, Agent, or Firm* — Birch, Stewart, Kolasch & Birch, LLP

(57) ABSTRACT

A method for forming a package structure includes forming an under bump metallization (UBM) layer over a metal pad and forming a photoresist layer over the UBM layer. The method further includes patterning the photoresist layer to form an opening in the photoresist layer. The method also includes forming a first bump structure over the first portion of the UBM layer. The first bump structure includes a first barrier layer over a first pillar layer. The method includes placing a second bump structure over the first bump structure. The second bump structure includes a second barrier layer over a second pillar layer. The method further includes reflowing the first bump structure and the second bump structure to form a solder joint between a first inter intermetallic compound (IMC) and a second IMC.

20 Claims, 24 Drawing Sheets

Related U.S. Application Data

(60) Provisional application No. 62/598,594, filed on Dec. 14, 2017.

(52) U.S. Cl.
CPC .............. *H01L 24/05* (2013.01); *H01L 24/11* (2013.01); *H01L 24/16* (2013.01); *H01L 24/81* (2013.01); *H01L 2224/0362* (2013.01); *H01L 2224/03622* (2013.01); *H01L 2224/0401* (2013.01); *H01L 2224/10145* (2013.01); *H01L 2224/1145* (2013.01); *H01L 2224/1147* (2013.01); *H01L 2224/11462* (2013.01); *H01L 2224/11614* (2013.01); *H01L 2224/11831* (2013.01); *H01L 2224/11849* (2013.01); *H01L 2224/13012* (2013.01); *H01L 2224/13013* (2013.01); *H01L 2224/13014* (2013.01); *H01L 2224/13017* (2013.01); *H01L 2224/13018* (2013.01); *H01L 2224/13083* (2013.01); *H01L 2224/13084* (2013.01); *H01L 2224/13147* (2013.01); *H01L 2224/13155* (2013.01); *H01L 2224/16165* (2013.01); *H01L 2224/16227* (2013.01); *H01L 2224/16503* (2013.01); *H01L 2224/16507* (2013.01); *H01L 2224/73204* (2013.01); *H01L 2224/8181* (2013.01); *H01L 2224/81193* (2013.01); *H01L 2224/81815* (2013.01); *H01L 2924/01327* (2013.01); *H01L 2924/2064* (2013.01)

(58) Field of Classification Search
CPC ... H01L 2224/0401; H01L 2224/16227; H01L 2225/06513; H01L 23/49827; H01L 2224/11849; H01L 2224/81815; H01L 2224/8181; H01L 24/17; H01L 24/13; H01L 24/05; H01L 24/11; H01L 24/16; H01L 24/81; H01L 2224/16165; H01L 2224/73204; H01L 2224/81193; H01L 2021/60247; H01L 2224/16503; H01L 2224/16507; H01L 2924/01327; H01L 2224/81203; H01L 2224/81902; H01L 2224/17505; H01L 2225/06517; H01L 25/0657; H01L 2224/0558; H01L 2224/16145; H01L 2224/13018; H01L 2224/13084; H01L 2224/16058; H01L 2224/16059

See application file for complete search history.

(56) References Cited

U.S. PATENT DOCUMENTS

| | | | |
|---|---|---|---|
| 9,147,661 B1 * | 9/2015 | Kwon | ..................... H01L 24/13 |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,872,870 B2 * | 12/2020 | Chen | ..................... H01L 24/05 |
| 2014/0346672 A1 | 11/2014 | Lin et al. | |
| 2018/0151537 A1 | 5/2018 | Huang et al. | |

* cited by examiner

METHOD FOR FORMING PACKAGE STRUCTURE WITH A BARRIER LAYER

CROSS REFERENCE TO RELATED APPLICATIONS

This application is a divisional application of U.S. application Ser. No. 16/194,927, filed Nov. 19, 2018, which claims the benefit of U.S. Provisional Application No. 62/598,594, filed on Dec. 14, 2017, the entirety of which are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

New packaging technologies, such as package on package (PoP), have begun to be developed, in which a top package with a device die is bonded to a bottom package, with another device die. By adopting these new packaging technologies, various packages with different or similar functions can be integrated together.

Although existing package structures and methods of fabricating package structures have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1G' shows a cross-sectional representation of a first bump structure, in accordance with some embodiments of the disclosure.

FIG. 3A' shows a cross-sectional representation of a first bump structure after the reflow process, in accordance with some embodiments of the disclosure.

FIG. 4C' shows a cross-sectional representation of a package structure, in accordance with some embodiments of the disclosure.

DETAILED DESCRIPTION

Figure 1A:
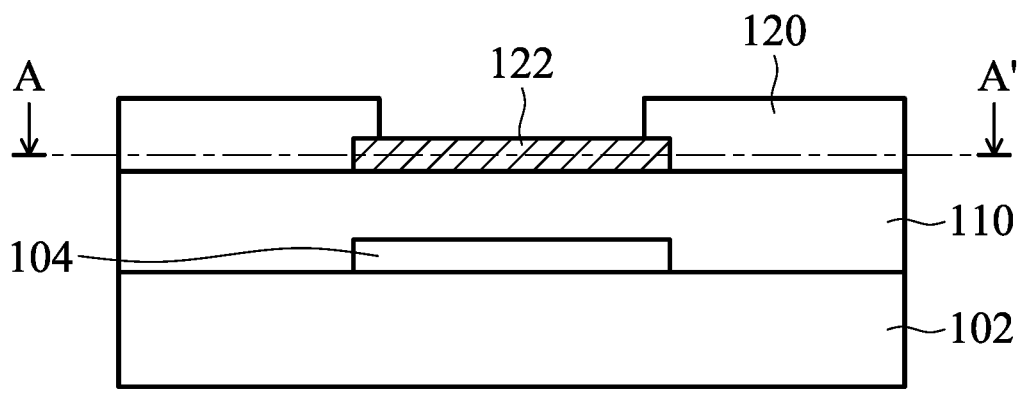
FIGS. 1A-1H show cross-sectional representations of various stages of forming a first bump structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments for a package structure and method for forming the same are provided. FIGS. 1A-1H show cross-sectional representations of various stages of forming a first bump structure 100a, in accordance with some embodiments of the disclosure.

As shown in FIG. 1A, a substrate 102 is provided. The substrate 102 may be made of silicon (Si) or another semiconductor material, such as germanium (Ge). In some embodiments, the substrate 102 is a substrate of a device die. In some embodiments, the substrate 102 is made of a compound semiconductor such as silicon carbide, gallium arsenic, indium arsenide, or indium phosphide. In some embodiments, the substrate 102 is made of semiconductor material, ceramic material, polymer material, metal material, another applicable material or a combination thereof. In some embodiments, the substrate 102 is a glass substrate. In some embodiments, the substrate 102 is a semiconductor substrate, such as silicon wafer.

The device elements 104 are formed on substrate 102. The device elements 104 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements 104, such as deposition, etching, implantation, photolithography, annealing, and/or other applicable processes. In some embodiments, device elements 104 are formed in the substrate 102 in a front-end-of-line (FEOL) process.

The substrate 102 may include various doped regions such as p-type wells or n-type wells). Doped regions may be doped with p-type dopants, such as boron or $BF_2$, and/or n-type dopants, such as phosphorus (P) or arsenic (As). The doped regions may be formed in or on the substrate 102, in a P-well structure, in an N-well structure, or in a dual-well structure.

The substrate 102 may further include isolation features (not shown), such as shallow trench isolation (STI) features or local oxidation of silicon (LOCOS) features. Isolation features may define and isolate various device elements.

A conductive pad 122 is formed over the ILD layer 110, and a dielectric layer 120 is formed over the ILD layer 110 and the conductive pad 122. The dielectric layer 120 is patterned to form a recess to expose the conductive pad 122. The patterning process includes a photolithography process and an etching process. Examples of a photolithography process include soft baking, mask aligning, exposure, post-exposure baking, developing the photoresist, rinsing and drying (e.g., hard baking). The etching process may be a dry etching or a wet etching process. The conductive pad 122 is electrically connected to the device elements 104 through various metallic lines and vias in the dielectric layer 110.

The dielectric layer 120 is made of silicon oxide (SiOx), silicon nitride (SixNy), silicon oxynitride (SiON), dielectric material(s) with low dielectric constant (low-k), or combinations thereof. In some embodiments, the dielectric layer 120 is made of an extreme low-k (ELK) dielectric material with a dielectric constant (k) less than about 2.5. In some embodiments, ELK dielectric materials include carbon doped silicon oxide, amorphous fluorinated carbon, parylene, benzocyclobutene (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the dielectric layer 120 is deposited by a plasma enhanced chemical vapor deposition (PECVD) process or by a spin coating process.

The dielectric layer 120 and the conductive pad 122 are formed in a back-end-of-line (BEOL) process. The conductive pad 122 can be made of copper (Cu), copper alloy, aluminum (Al), aluminum alloy, tungsten (W), tungsten alloy, titanium (Ti), titanium alloy, tantalum (Ta) or tantalum alloy. In some embodiments, the conductive pad 122 is formed by a plating method.

Figure 1B:
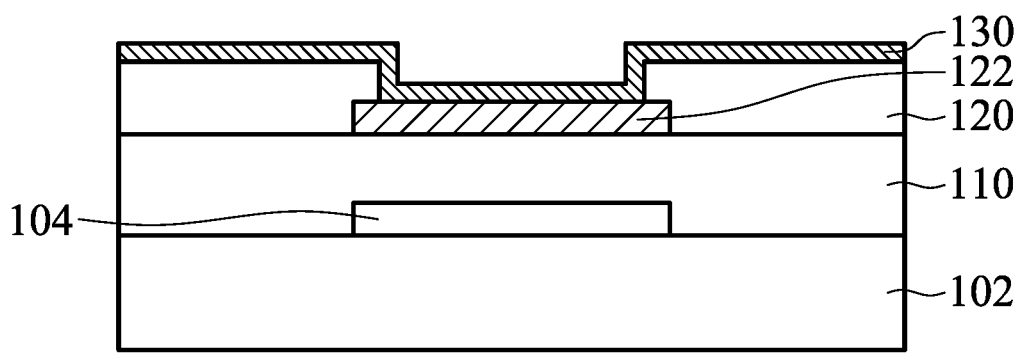

Next, as shown in FIG. 1B, a under bump metallurgy (UBM) layer 130 is formed over the conductive pad 122 and the dielectric layer 120, in accordance with some embodiments of the disclosure.

The UBM layer 130 may be made of conductive material, such as copper (Cu), copper alloy, aluminum (Al), aluminum alloy, tungsten (W), tungsten alloy, titanium (Ti), titanium alloy, tantalum (Ta) or tantalum alloy. In addition, the UBM layer 130 may contain an adhesion layer and/or a wetting layer. In some embodiments, the UBM layer 130 further includes a copper seed layer. In some embodiments, the UBM layer 130 includes an adhesion layer made of Ti/Cu and a wetting layer made of Cu.

Figure 1C:
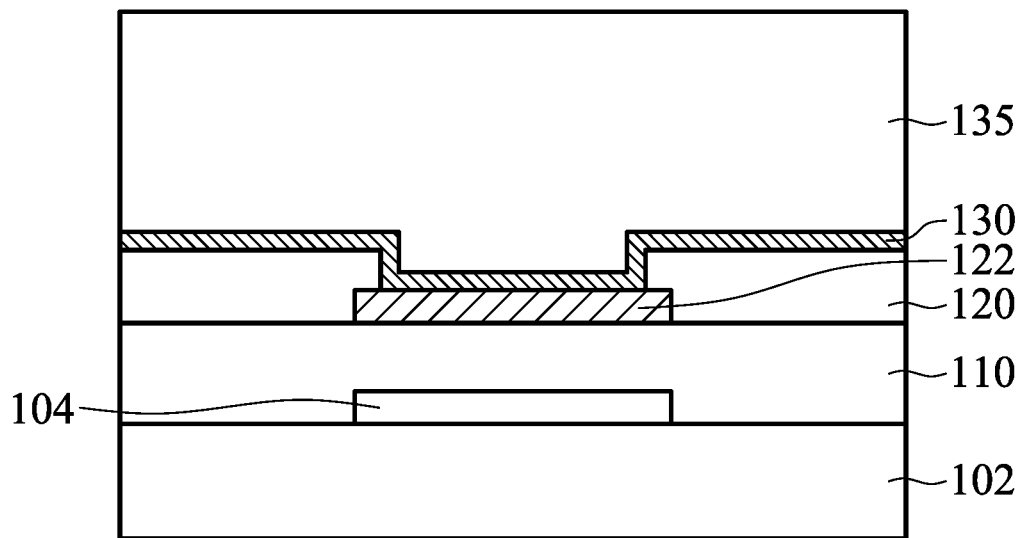

Next, as shown in FIG. 1C, a photoresist layer 135 is formed over the UBM layer 130, in accordance with some embodiments of the disclosure.

Figure 1D:
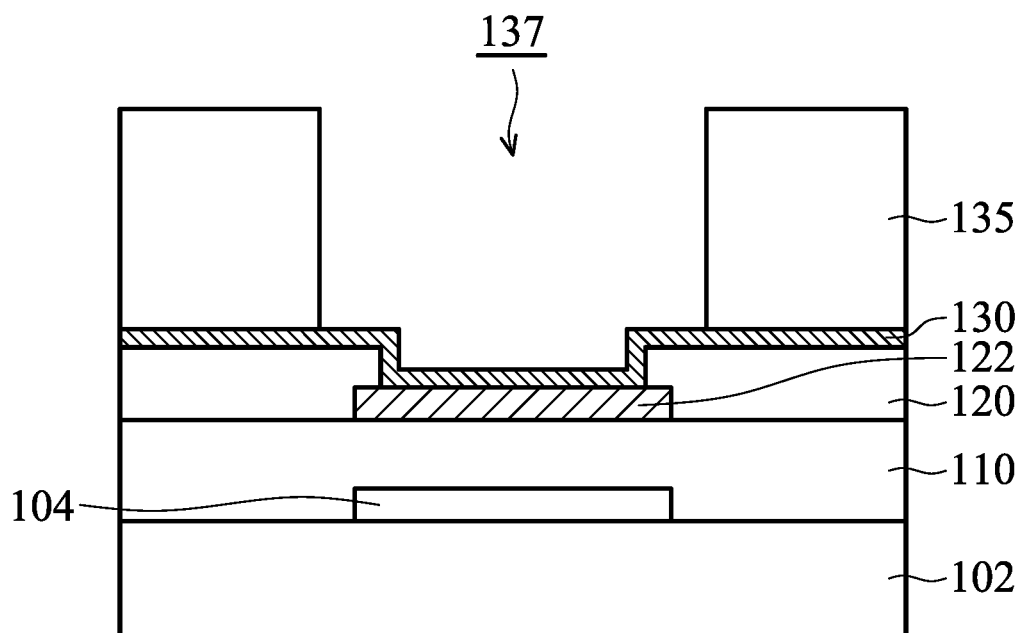

Afterwards, as shown in FIG. 1D, the photoresist layer 135 is patterned to form an opening 137 in the photoresist layer 135, in accordance with some embodiments of the disclosure. As a result, a portion of the UBM layer 130 is exposed by the opening 137.

Figure 1E:
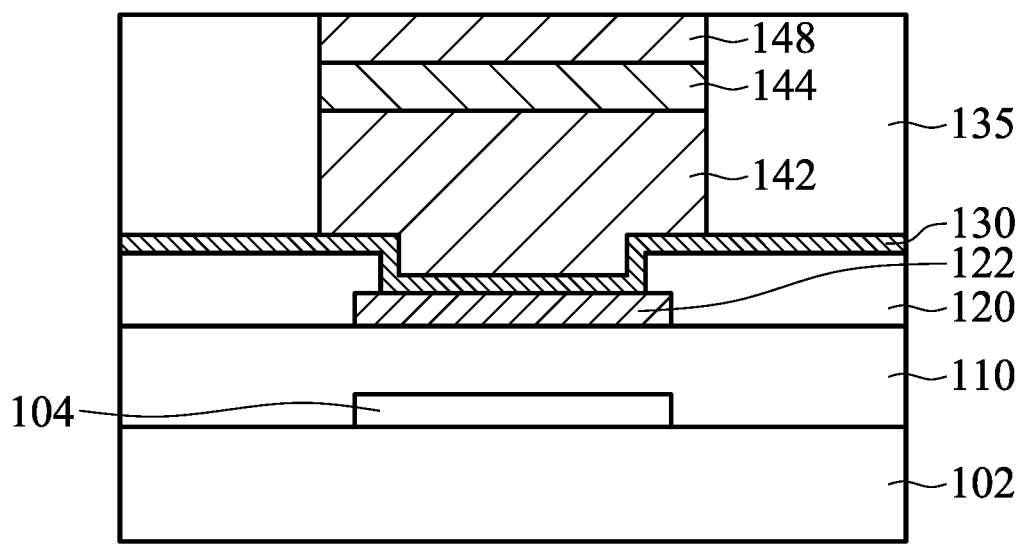

Next, as shown in FIG. 1E, a first pillar layer 142, a first barrier layer 144 and a first solder layer 148 are sequentially formed in the opening 137, in accordance with some embodiments of the disclosure.

The first pillar layer 142 and the first barrier layer 144 are made of different materials. In some embodiments, the first pillar layer 142 is made of a metal layer, such as copper, copper alloy, nickel, nickel alloy, aluminum, aluminum alloy, tin, tin alloy, lead, lead alloy, silver, silver alloy or a combination thereof. In some embodiments, the first barrier layer 144 is made of a metal layer, such as copper, copper alloy, nickel, nickel alloy, aluminum, aluminum alloy, tin, tin alloy, lead, lead alloy, silver, silver alloy or a combination thereof. In some embodiments, the first solder layer 148 is made of tin (Sn), SnAg, SnPb, SnAgCu, SnAgZn, SnZn, SnBiIn, SnIn, SnAu, SnPb, SnCu, SnZnIn, SnAgSb or another applicable material. In some embodiments, the first pillar layer 142 is made of copper (Cu), the first barrier layer 144 is made of nickel (Ni), and the solder layer 148 is made of tin (Sn). In some embodiments, the first pillar layer 142, the first barrier layer 144 and the first solder layer 148 are independently formed by a deposition process, such as an electroplating process, a physical vapor deposition (PVD) process, a chemical vapor deposition (CVD) process, or another applicable process.

Figure 1F:
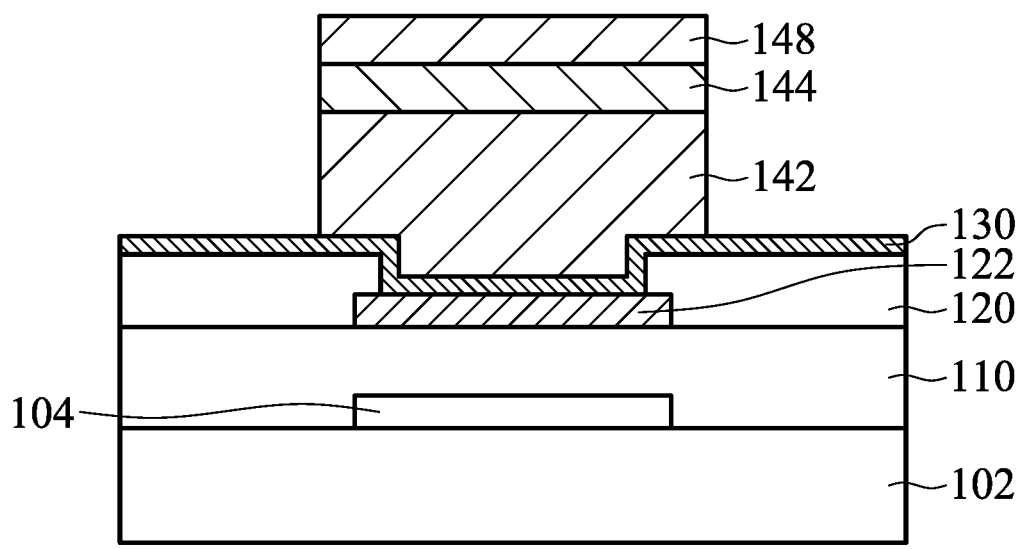

Afterwards, as shown in FIG. 1F, the patterned photoresist layer 135 is removed to expose a portion of the UBM layer 130, in accordance with some embodiments of the disclosure. In some embodiments, the patterned photoresist layer 135 is removed by a wet etching process.

Figure 1G:
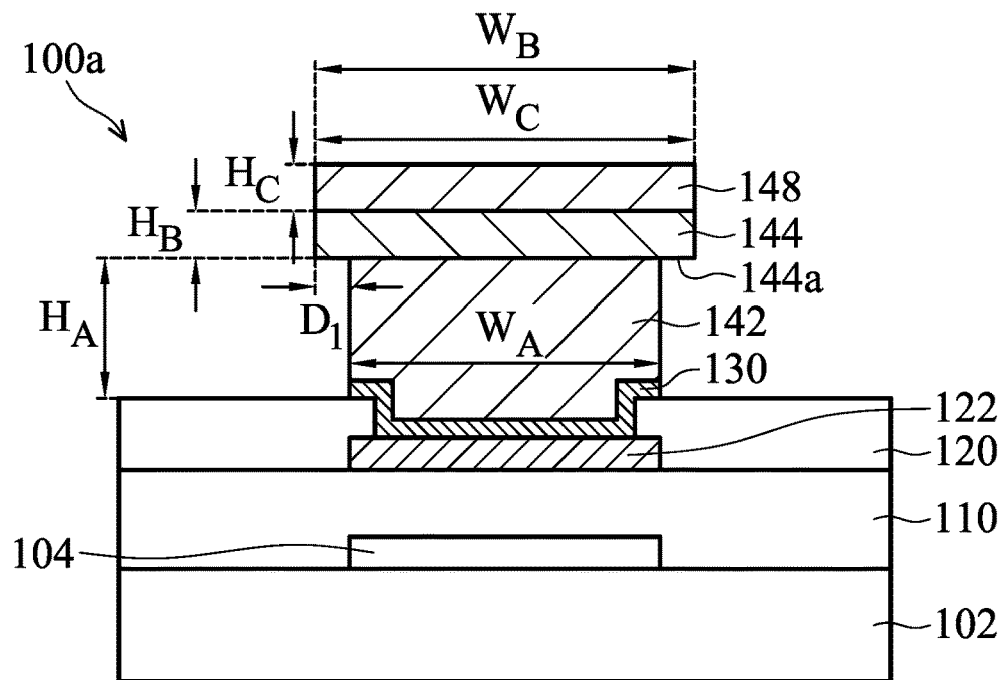
Figure 1G:
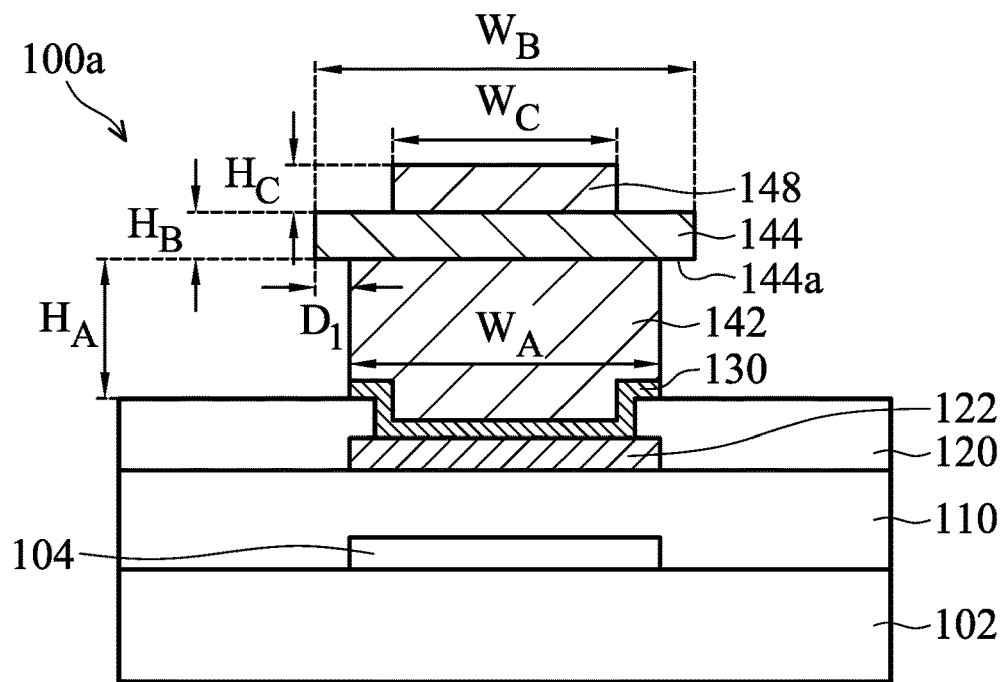

Subsequently, as shown in FIG. 1G the exposed portion of the UBM layer 130, a portion of the first pillar layer 142 and a portion of the solder layer 148 are removed, in accordance with some embodiments of the disclosure. As a result, the first barrier layer 144 is wider than the first pillar layer 142 and the first solder layer 148. In some embodiments, the exposed portion of the UBM layer 130, the portion of the first pillar layer 142 and the portion of the solder layer 148 are removed by a wet etching process. The wet etching solution is used to remove the UBM layer 130, a portion of the first pillar layer 142 and a portion of the solder layer 148, but not to remove the first barrier layer 144. In other words, the etching process provides a high etching selectivity of the UBM layer 130 and the first pillar layer 142 relative to the first barrier layer 144. In some embodiments, the wet etching process includes phosphoric acid ($H_3PO_4$) solution, hydrogen peroxide ($H_2O_2$) solution or another applicable solution.

If the first barrier layer 144 is not wider than the first pillar later 142, the first solder layer 148 may flow downward, and the reminding solder material on the first barrier layer 144 may be not enough to connect with another bump structure, such that a short-circuit problem occurs. When the first barrier layer 144 is wider than the first pillar later 142, the first solder layer 148 may be prevent from flowing downward such that the solder material is not contact with the first pillar layer 142 and short-circuit. In order to prevent short-circuits, the first barrier layer 144 is used as a barrier structure to prevent the first solder layer 148 and other layers (such as an IMC layer, formed later, as shown in FIG. 4C) from flowing downward. Therefore, the first barrier layer 144 has a protruding portion 144a which extends away from the sidewall surface of the first pillar layer 142.

The first pillar layer 142 has a first width $W_A$ in a horizontal direction, the first barrier layer 144 has a second width $W_B$ in the horizontal direction, and the first solder layer 148 has a third width $W_C$ in the horizontal direction. In some embodiments, the second width $W_B$ is greater than the first width $W_A$. In some embodiments, the first width $W_A$ is equal to, greater than or smaller than the third width $W_C$. In some embodiments, as shown in FIG. 1G', the first width $W_A$ is wider than the third width $W_C$.

The distance $D_1$ between the sidewall surface of the first pillar layer 142 and the sidewall surface of the first barrier layer 144 is in a range from about 0.5 μm to about 3 μm. If the distance $D_1$ is smaller than 0.5 μm, the first solder layer 148 may flow downward. If the distance $D_1$ is greater than 3 μm, the pitch between two adjacent first barrier layers 144 may be limited. Therefore, when the distance $D_1$ is within above-mentioned range, the first barrier layer 144 can effectively prevent the first solder layer 148 from flowing downward. In some embodiments, a ratio of the distance $D_1$ to the first width $W_A$ is in a range from about 0.15 to about 0.4.

The first pillar layer 142 has a first height $H_A$ in a vertical direction, the first barrier layer 144 has a second height $H_B$ in the vertical direction, and the first solder layer 148 has a third height $H_C$ in the vertical direction. In some embodiments, the first height $H_A$ is greater than the second height $H_B$ and the third height $H_C$.

Figure 1H:
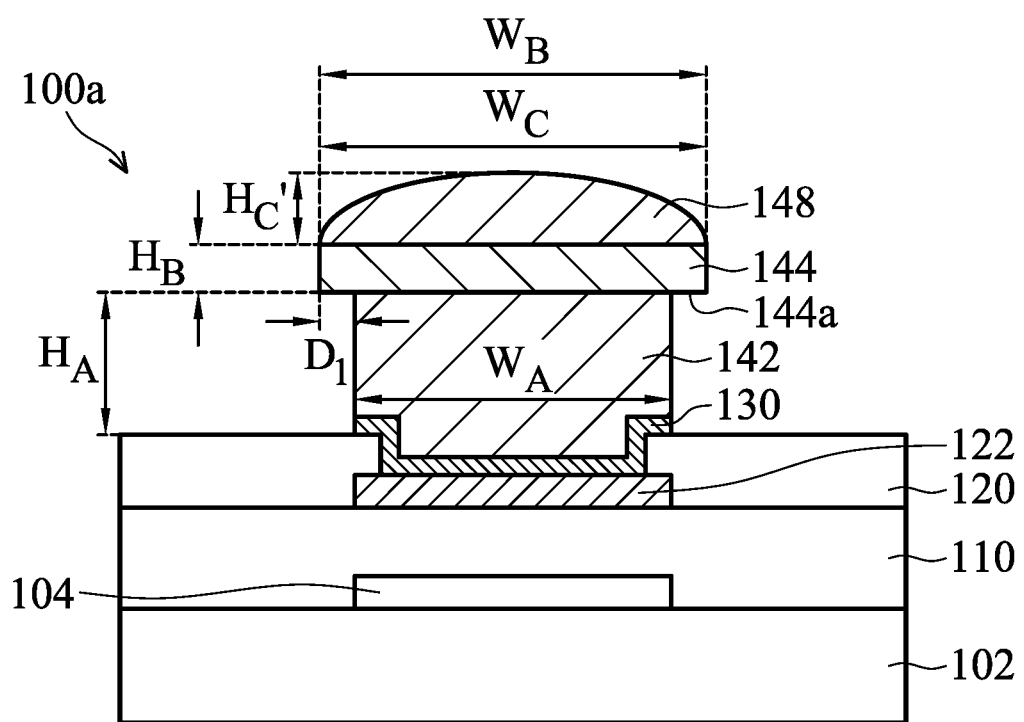

Subsequently, as shown in FIG. 1H, a reflow process is performed on the first solder layer 148, in accordance with some embodiments of the disclosure. The width of the first solder layer 148 is substantially equal to the width of the first barrier layer 144. In addition, the reflowed first solder layer 148 has a third height Hc'. The third height Hc' is greater than the third height $H_C$.

It should be noted that the first barrier layer 144 has a protruding portion to prevent the first solder layer 148 from flowing downward. Therefore, the reliability of the first bump structure 100a is improved by forming the protruding first barrier layer 144.

Furthermore, the first pillar layer 142, the first barrier layer 144 and the first solder layer 148 are formed in the opening 137 of the photoresist layer 135, and therefore the sidewall surfaces of the first pillar layer 142, the sidewall surfaces of the first barrier layer 144 and the sidewall surfaces of the first solder layer 148 in FIG. 1E are aligned with each other. Therefore, the misalignment problem of these layers can be prevented. Afterwards, the width difference between the first pillar layer 142 and the first barrier layer 144 is fabricated by etching a portion of the first pillar layer 142 and the exposed portion of the UBM layer 130. The removal of the first pillar layer 142 and the removal of the UBM layer 130 are performed in the same process without the need for an extra etching process for removing the portion of the first pillar layer 142.

Figure 2A:
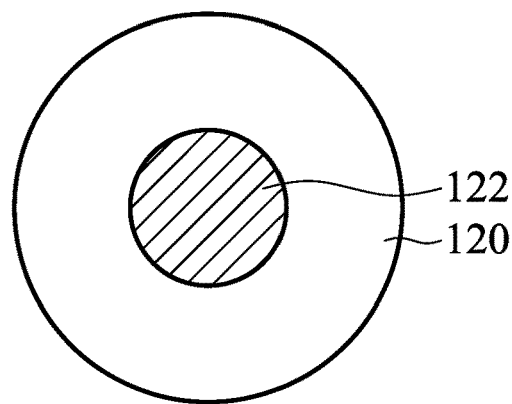
FIGS. 2A-2G show top views of the conductive pad and the dielectric layer taken along A-A' line of FIG. 1A, in accordance with some embodiments of the disclosure.
Figure 2B:
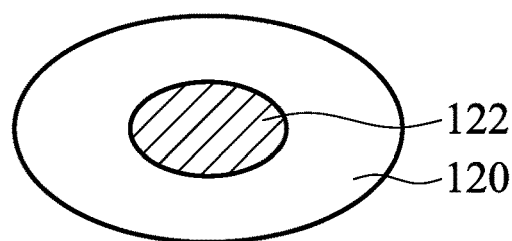
Figure 2C:
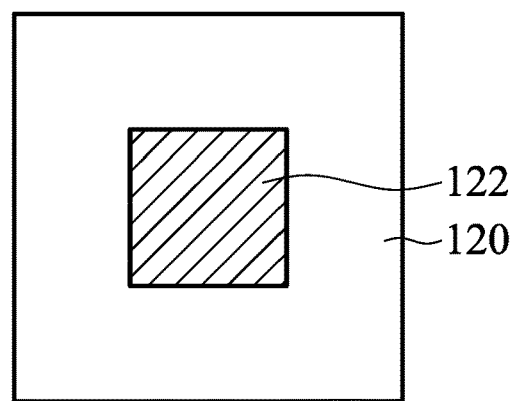
Figure 2D:
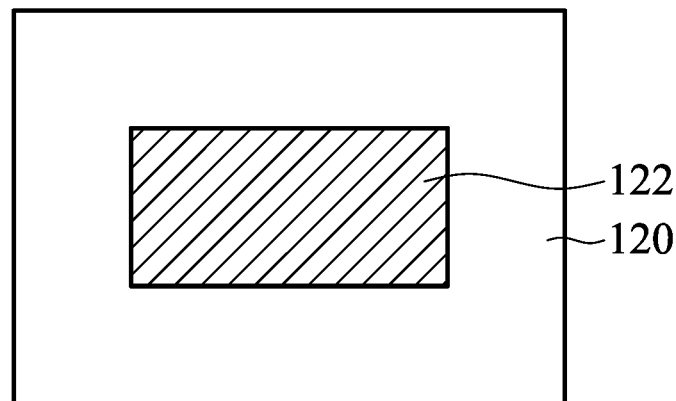
Figure 2E:
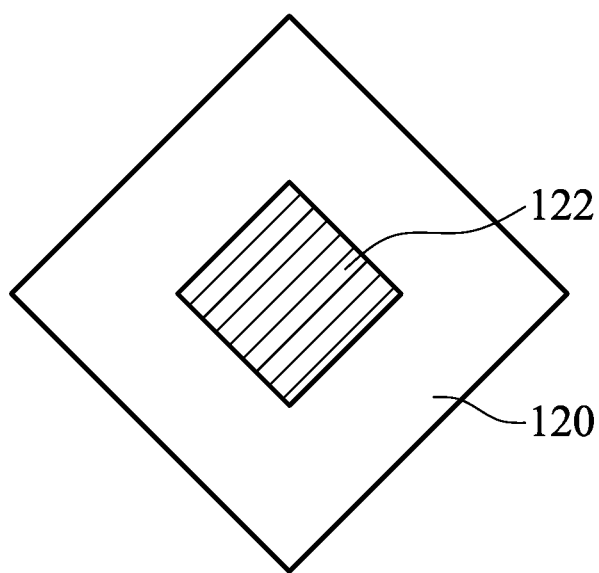
Figure 2F:
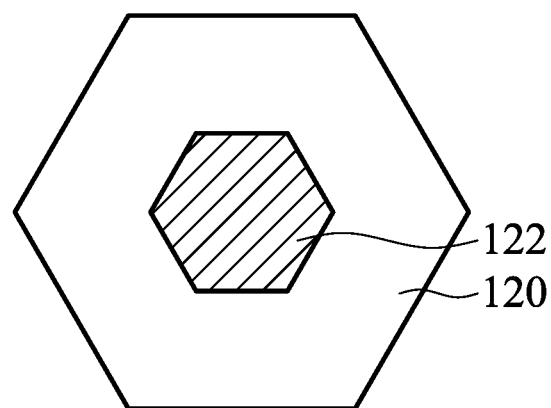
Figure 2G:
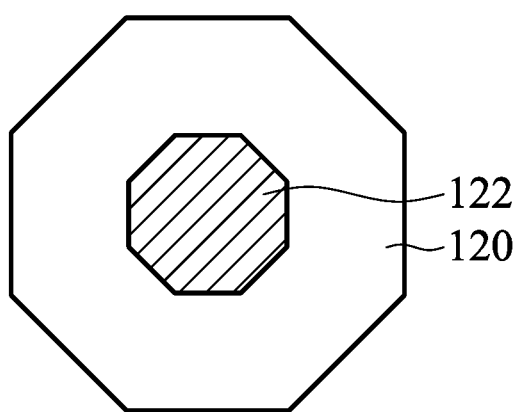

FIGS. 2A-2G show top views of the conductive pad 122 and the dielectric layer 120 taken along A-A' line of FIG. 1A, in accordance with some embodiments of the disclosure. A top-view of the conductive pad 122 includes a circle (FIG. 2A), oval (FIG. 2B, square (FIG. 2C), rectangle (FIG. 2D), diamond (FIG. 2E) or polygon shape (FIG. 2F and FIG. 2G).

Figure 3A:
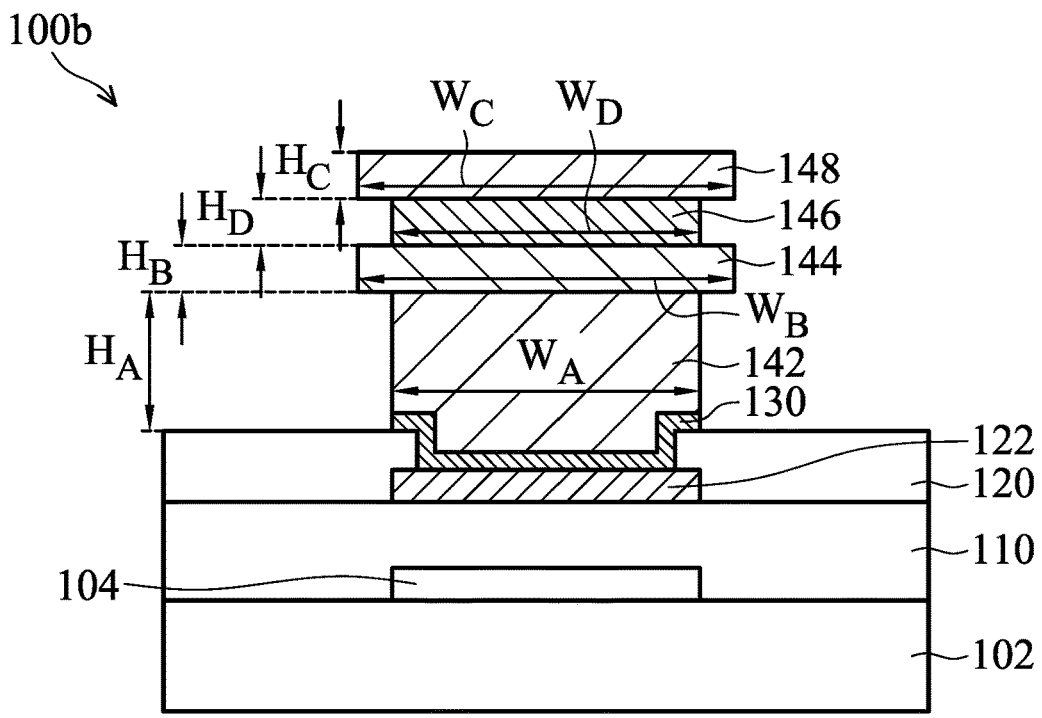
FIG. 3A shows a cross-sectional representation of a first bump structure, in accordance with some embodiments of the disclosure.
Figure 3A:
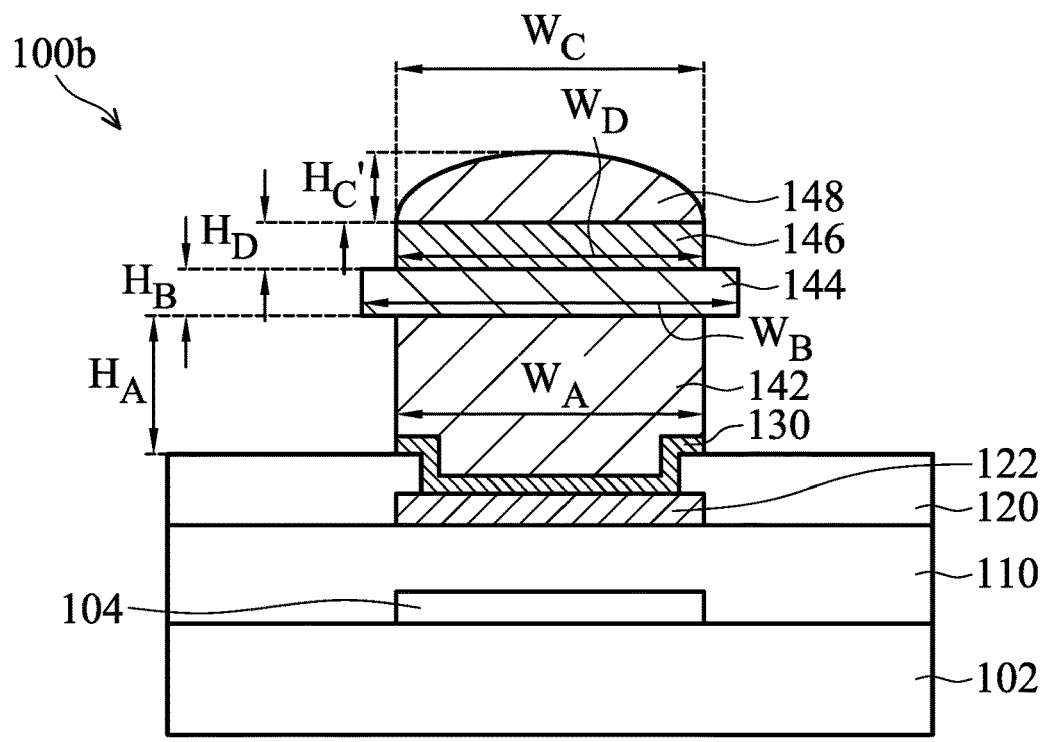

FIG. 3A shows a cross-sectional representation of a first bump structure 100b, in accordance with some embodiments of the disclosure. The first bump structure 110b is similar to the first bump structure 100a, the difference between FIG. 3A and FIG. 1G is that a first cap layer 146 is formed over the first barrier layer 144 in the first bump structure 110b.

The first cap layer 146 is used to form more amount of the IMC (formed later, in FIG. 4C), and therefore the risk of the movement of the first solder layer 148 is reduced. The first cap layer 146 and the first barrier layer 144 are made of different materials. The first cap layer 146 and the first pillar layer 142 may be made of a same material. In some embodiments, the first cap layer 146 is made of a metal layer, such as copper, copper alloy, nickel, nickel alloy, aluminum, aluminum alloy, tin, tin alloy, lead, lead alloy, silver, silver alloy or a combination thereof. In some embodiments, the first pillar layer 142 is made of copper (Cu), the first barrier layer 144 is made of nickel (Ni), and the first cap layer 146 is made of copper. In some embodiments, the first cap layer 146 is formed by a deposition process, such as an electroplating process, a physical vapor deposition (PVD) process, a chemical vapor deposition (CVD) process, or another applicable process.

The first cap layer 146 has a fourth width $W_D$ in the horizontal direction and a fourth height $H_D$ in the vertical direction. In some embodiments, the second width $W_B$ of the first barrier layer 144 is greater than the fourth width $W_D$ of the first cap layer 146. In some embodiments, the first height $H_A$ of the first pillar layer 142 is greater than the fourth height $H_D$ of the first cap layer 146. The first cap layer 146 has a planar top surface, and a vertical sidewall surface.

The first cap layer 146 is formed on the first barrier layer 144, and then a portion of the first cap layer 146 and a portion of the first pillar layer 142 have been removed by a same wet etching process. Therefore, the first barrier layer 144 extends away from the sidewall surface of the first pillar layer 142.

FIG. 3A' shows a cross-sectional representation of a first bump structure 100b after the reflow process, in accordance with some embodiments of the disclosure. The reflow process is performed on the first solder layer 148. The width of the first solder layer 148 is substantially equal to the width of the first barrier layer 144 after the reflow process. In addition, the reflowed first solder layer 148 has a third height Hc'. The third height Hc' is greater than the third height $H_C$.

Figure 3B:
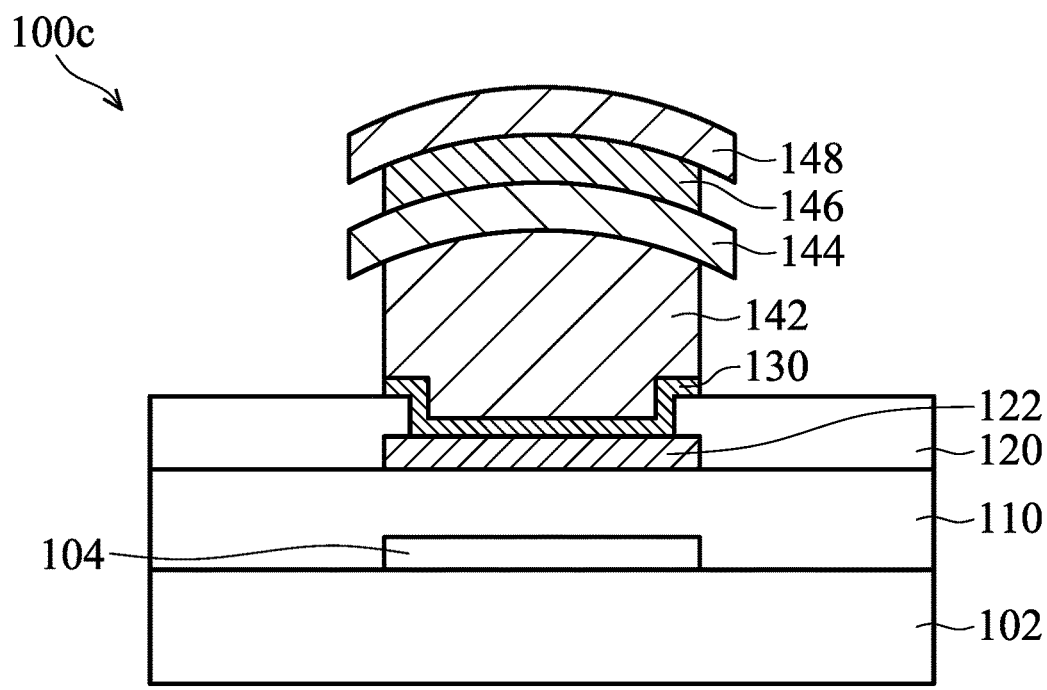
FIG. 3B shows a cross-sectional representation of a first bump structure, in accordance with some embodiments of the disclosure.

FIG. 3B shows a cross-sectional representation of a first bump structure 100c, in accordance with some embodiments of the disclosure. The first bump structure 100c is similar to the first bump structure 100b, the difference between FIG. 3B and FIG. 3A is that the first barrier layer 144 has a convex top surface in the first bump structure 100c. Furthermore, the first cap layer 146 is formed along the shape of the first barrier layer 144, and therefore the first cap layer 146 also has a convex top surface. The first solder layer 148 also has a convex top surface. In addition, the first barrier layer 144 has a sloped sidewall surface. In some embodiments, the deposition parameters (electroplating solution, electroplating time) of the deposition process are controlled to form the convex top surface of the first barrier layer 144. In some embodiments, the convex top surface of the first barrier layer 144 is obtained by controlling the concentration, the content, and the temperature of the electroplating solution, and controlling the current of the plating process.

Figure 3C:
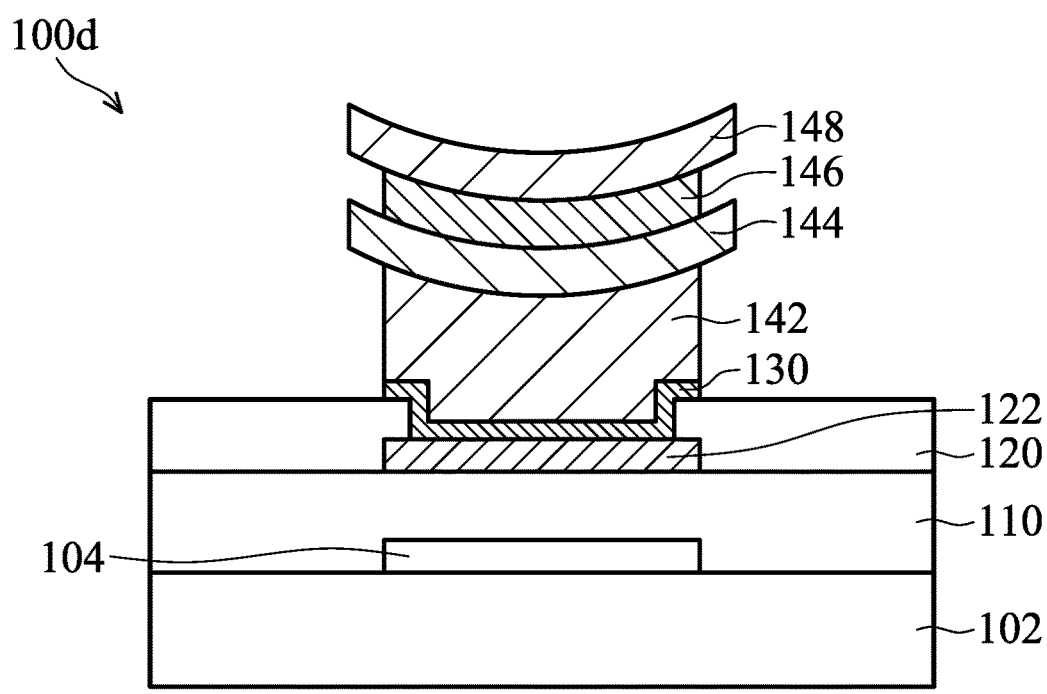
FIG. 3C shows a cross-sectional representation of a first bump structure, in accordance with some embodiments of the disclosure.

FIG. 3C shows a cross-sectional representation of a first bump structure 100d, in accordance with some embodiments of the disclosure. The first bump structure 100d is similar to the first bump structure 100b, the difference between FIG. 3C and FIG. 3A is that the first barrier layer 144 has a concave top surface in the first bump structure 100d. The first cap layer 146 also has a concave top surface and the first solder layer 148 also has a concave top surface. In some embodiments, the concave top surface of the first barrier layer 144 is obtained by controlling the concentration, the content, and the temperature of the electroplating solution, and controlling the current of the plating process. In addition, the first barrier layer 144 has a sloped sidewall surface.

Figure 4A:
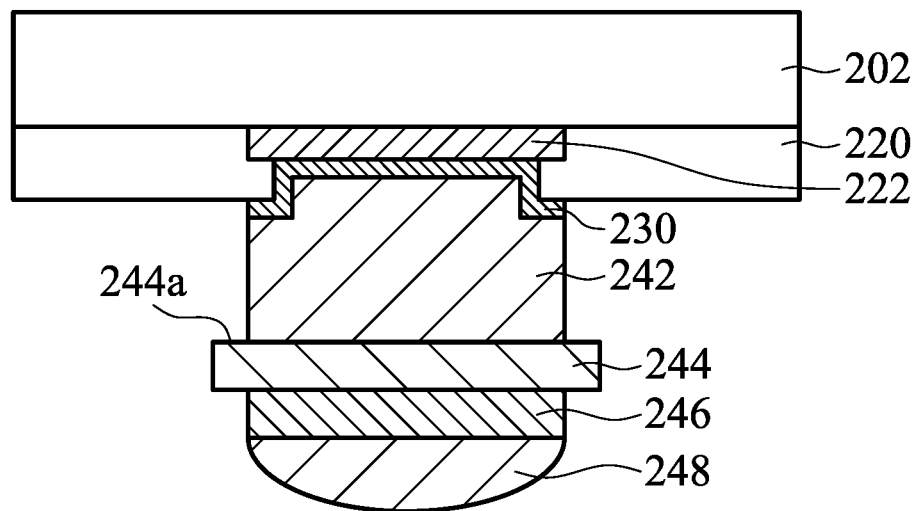
FIGS. 4A-4C show cross-sectional representations of various stages of forming a package structure, in accordance with some embodiments of the disclosure.
Figure 4A:
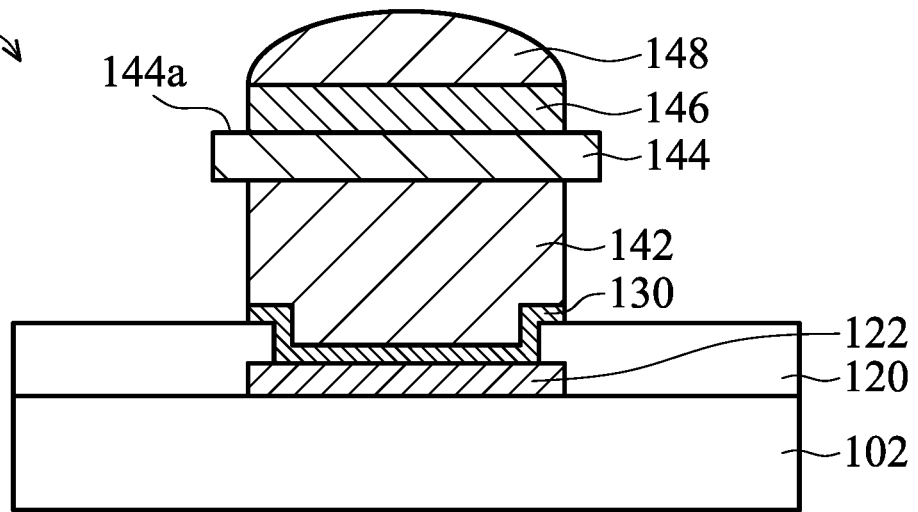
Figure 4B:
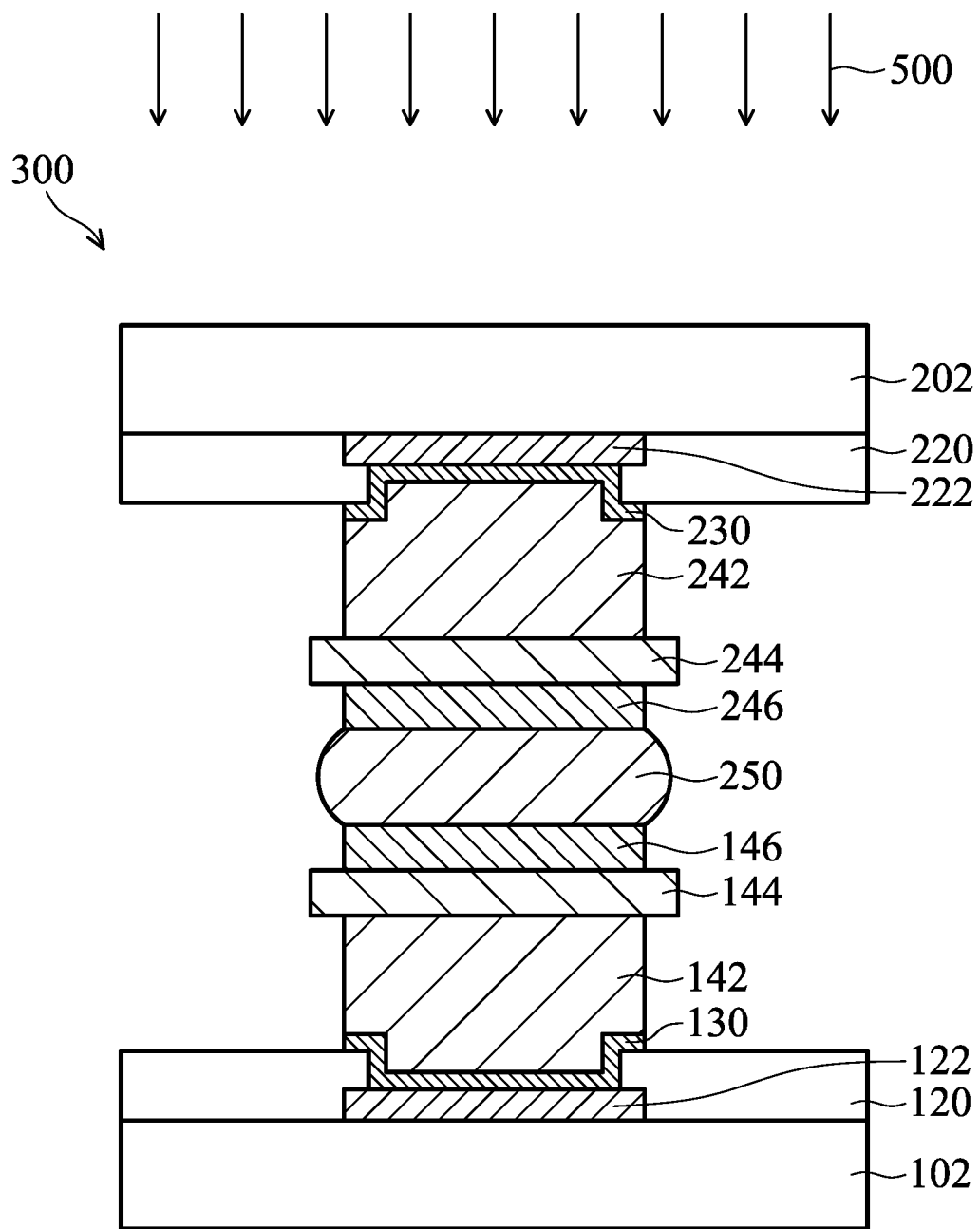
Figure 4C:
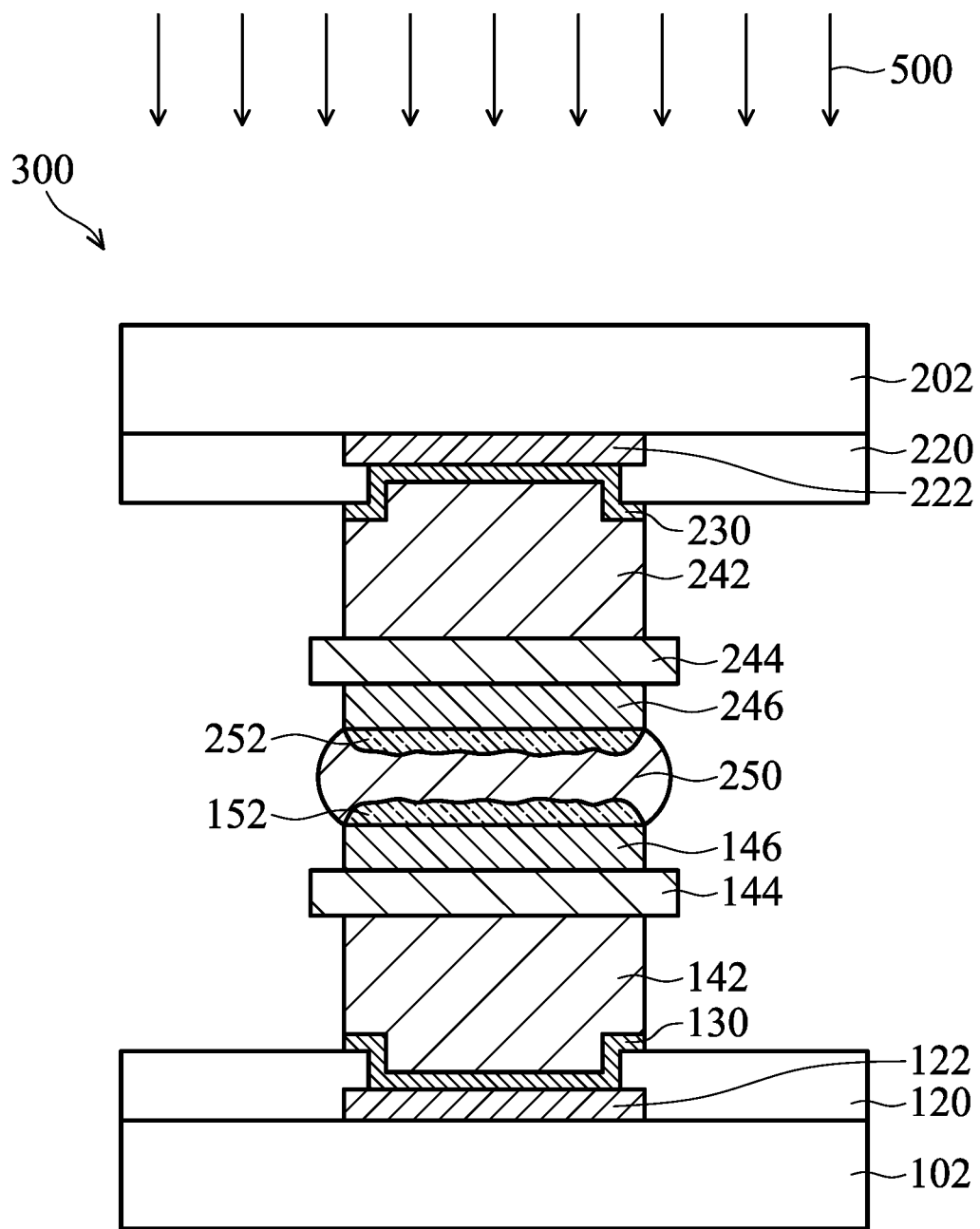
Figure 4C:
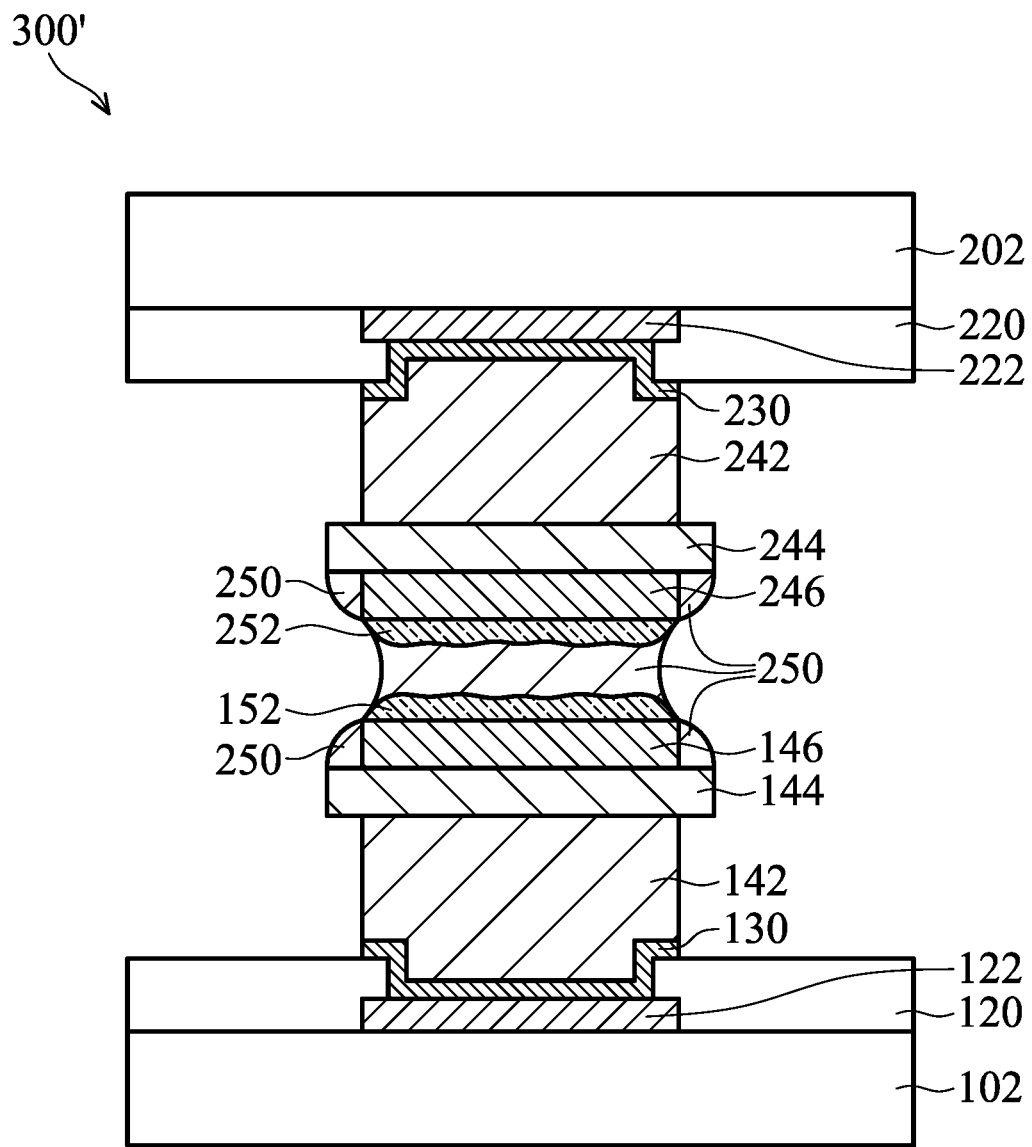

FIGS. 4A-4C show cross-sectional representations of various stages of forming a package structure 300, in accordance with some embodiments of the disclosure.

As shown in FIG. 4A, a first bump structure 100 and a second bump structure 200 are provided, in accordance with some embodiments of the disclosure. The first bump structure 100 is similar to, or the same as, the second bump structure 200. The second bump structure 200 is formed over a second substrate 202. A second dielectric layer 220 is formed over the second substrate 202, and a second conductive layer 222 is formed in the second dielectric layer 220. The second bump structure 200 includes a second UBM 230, a second pillar layer 242, the second barrier layer 244, the second cap layer 246 and the second solder layer 248. Similar to the first barrier layer 144, the second barrier layer 244 also has a protruding portion 244a which extends away from the sidewall surface of the second pillar layer 242.

Afterwards, as shown in FIG. 4B, a reflow process 500 is performed to bond the first bump structure 100 and the second bump structure 200 together to form a package structure 300, in accordance with some embodiments.

In some embodiments, the reflow process is performed at a melting point temperature of the first solder layer 148 and/or the second solder layer 248. In some embodiments, the reflow process is performed at a temperature in a range from about 100 degrees Celsius to about 300 degrees Celsius. When the temperature is within above-mentioned range, the bonding quality and bonding yield are improved. However, embodiments of the disclosure are not limited thereto. During the reflow process, the first solder layer 148 and the second solder layer 248 are melted and reshaped to together form a solder joint 250.

Next, as shown in FIG. 4C, during the reflow process 500, a first intermetallic compound (IMC) 152 and a second IMC 252 are formed, in accordance with some embodiments. The first IMC 152 is between the first cap layer 146 and the solder joint 250, and the second IMC 252 is between the second cap layer 246 and the solder joint 250.

The first IMC 152 and the second IMC 252 may be a substance formed when solder comes in contact with another metal at an elevated temperature. As a result, the first IMC 152 and the second IMC 252 include solder and the other metal (e.g., metal for forming the first cap layer 146 and the second cap layer 246). The first IMC 152 and the second IMC 252 have unique mechanical and electrical properties, which are different from those of the solder and the other metal. In some embodiments, the sidewall surface of the first barrier layer 144 laterally extends away from the sidewall surface of the first IMC 152.

The first IMC 152 and the second IMC 252 independently include materials from solder and the other metal. In some embodiments, the material (such as Sn) of the first solder layer 148 and the material (such as Cu) of the first cap layer 146 migrate and react with each other to form the first IMC 152. In some other embodiments, the material (such as Sn) of the first solder layer 148, the material (such as Cu) of the first cap layer 146 and the material (such as Ni) of the first barrier layer 144 migrate and react with each other to form the first IMC 152. The first IMC 152 may be referred to as an intermetallic alloy, an ordered intermetallic alloy, or a long-range-ordered alloy. The first IMC 152 is a solid-state compound containing two or more metallic elements, and exhibits metallic bonding and ordered crystal structure. In some embodiments, the first IMC 152 and the second IMC 252 independently include $Cu_6Sn_5$. In some other embodiments, the first IMC 152 and the second IMC 252 independently include $Ni_3Sn_4$, $AuSn_4$ or another suitable material.

FIG. 4C' shows a cross-sectional representation of a package structure 300', in accordance with some embodiments of the disclosure. The package structure 300' is similar to the package structure 300, the difference between FIG. 4C' and FIG. 4C is that the solder joint 250 flows to a first region and a second region. The first region is the sidewall surfaces of the first cap layer 146 and/or the sidewall surfaces of the second cap layer 246. The second region is the top surface of the first barrier layer 144 and/or the bottom surface of the second barrier layer 244. In some embodiments, portions of the sidewall surfaces of the first cap layer 146 are covered by the first IMC 152. In some embodiments, a portion of the sidewall surfaces of the second cap layer 246 is covered by the second IMC 252. A portion of the top surface of the first barrier layer 144 is covered by the solder joint 250. A portion of the bottom surface of the second barrier layer 244 is covered by the solder joint 250.

FIGS. 5A-5J show cross-sectional representations of various stages of forming a package structure 700, in accordance with some embodiments of the disclosure. The package structure may be a chip-on-wafer-on-substrate (CoWoS) package or another suitable package.

Figure 5A:
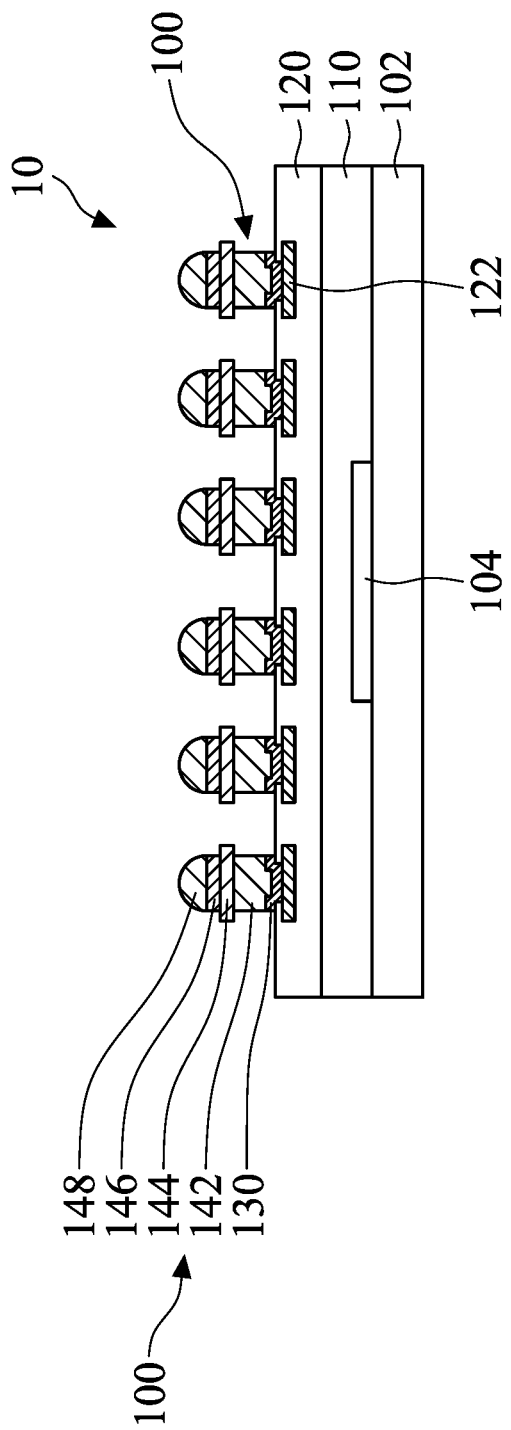
FIGS. 5A-5J show cross-sectional representations of various stages of forming a package structure, in accordance with some embodiments of the disclosure.

As shown in FIG. 5A, a first structure 10 is provided, in accordance with some embodiments of the disclosure. The first structure 10 includes the ILD layer 110 over the first substrate 102 and the device element 104 in the ILD layer 110. The dielectric layer 120 is formed over the ILD layer 110, and the conductive pad 122 formed in the dielectric layer 120. The first bump structure 100 is formed over the dielectric layer 120. In some embodiments, the first substrate 102 is an integrated circuit (IC) die which is sawed from a wafer, and may be a "known good die". In some embodiments, the IC die is a logic die, a memory die or another applicable type of die.

The first bump structure 100 includes the UBM layer 130, the first pillar layer 142, the first barrier layer 144, the first cap layer 146 and the first solder layer 148. The UBM layer 130 is formed over the dielectric layer 120, and the first pillar layer 142 is formed over the UBM layer 130. The first barrier layer 144 is formed over the first pillar layer 142, and the first cap layer 146 is formed over the first barrier layer 144. The first solder layer 148 is formed over the first cap layer 146. It should be noted that the width of the first barrier layer 144 is greater than the width of the first pillar layer 142 and/or the width of the first cap layer 146 and/or the width of the first solder layer 148.

Figure 5B:
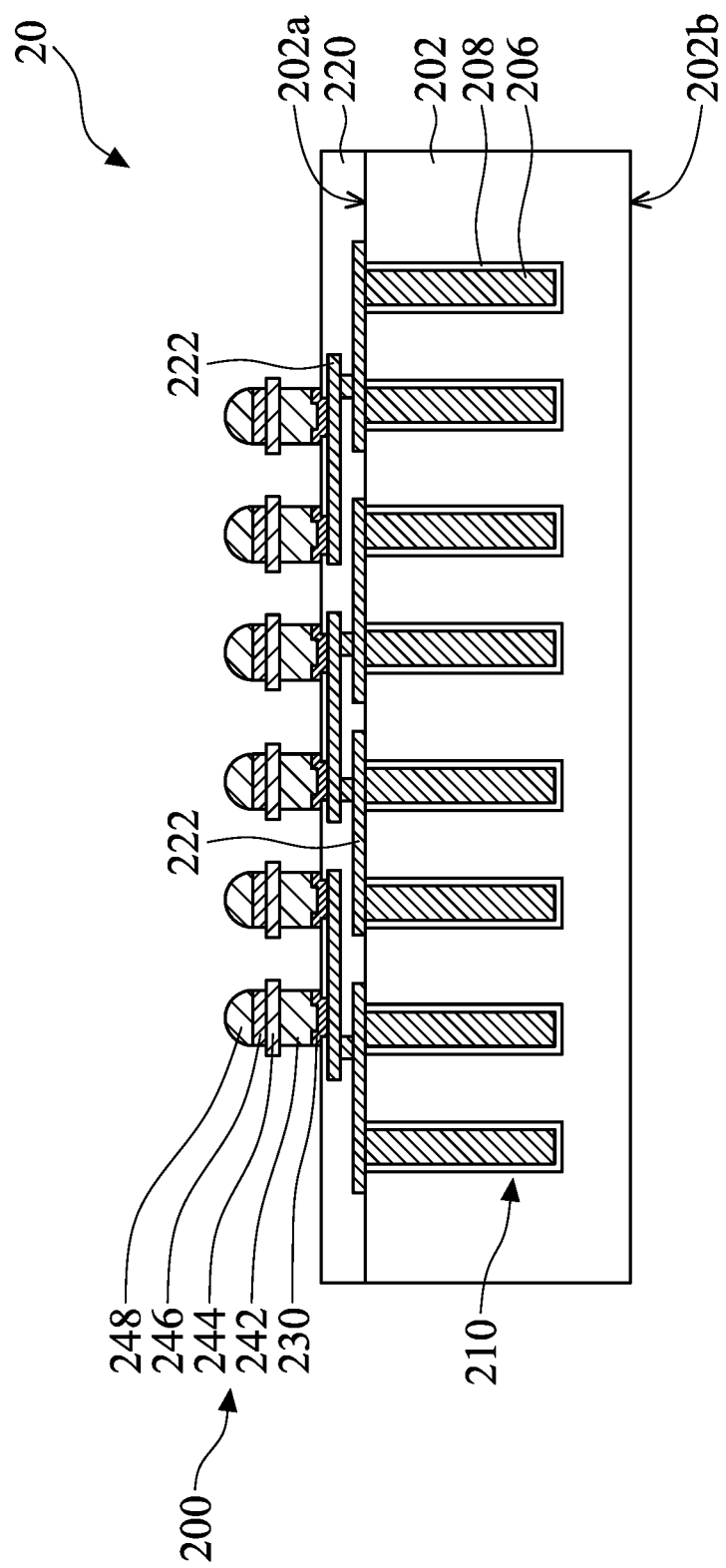

Next, as shown in FIG. 5B, a second structure 20 is provided, in accordance with some embodiments of the disclosure. In some embodiments, the second structure 20 is an interposer. The interposer may be free of active elements, such as transistors, diodes or another active element. The interposer may include, or may be free of passive elements, such as capacitors, resistors, inductors or another applicable element.

The second structure 20 includes a number of through-substrate-vias (TSVs) 210 formed in the second substrate 202. The second substrate 202 includes a first surface 202a and a second surface 202b oppositely to the first surface 202a. Each of the TSVs 210 includes a conductive structure 206 and a barrier layer 208 surrounding the conductive structure 206. The conductive structure 206 extends from the first surface 202a of the second substrate 202 towards to the second surface 202b of the second substrate 202. The dielectric layer 220 is formed over the second substrate 202, and the conductive layer 222 is formed in the dielectric layer 220. In some embodiments, the second conductive layer 222 is referred to redistribution layers (RDLs).

The second bump structure 200 is formed over the dielectric layer 220. The TSVs 210 are electrically connected to the second bump structure 200. The second bump structure 200 includes the second UBM layer 230, the second pillar layer 242, the second barrier layer 244, the second cap layer 246 and the second solder layer 248. The second UBM layer 230 is electrically connected to the second conductive layer 222.

Figure 5C:
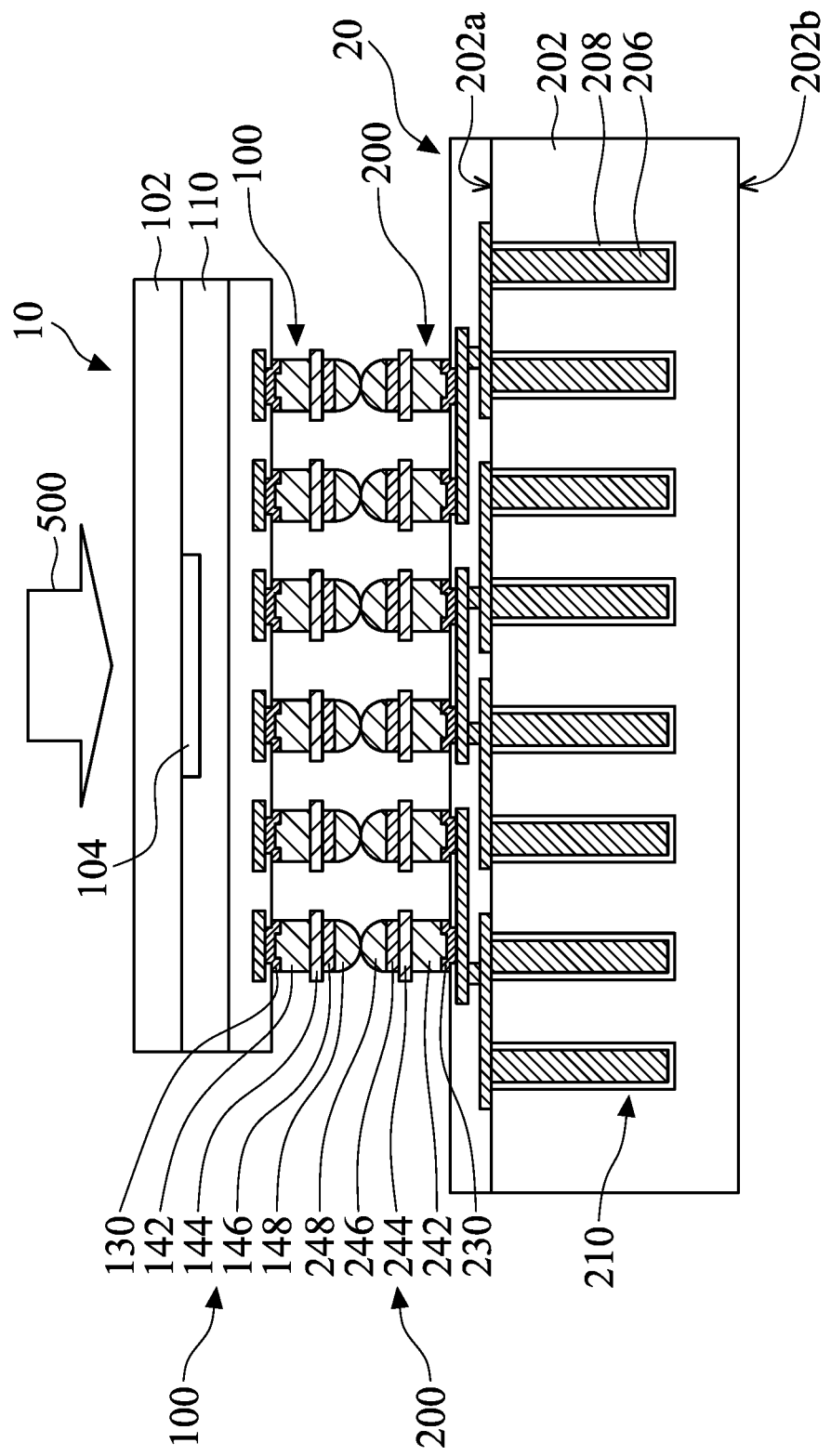

Next, as shown in FIG. 5C, the first structure 10 is turned upside down and placed over the second structure 20, in accordance with some embodiments of the disclosure. Afterwards, a reflow process 500 is performed on the first bump structure 100 and the second bump structure 200.

The first bump structure 100 of the first structure 10 is substantially aligned to the second bump structure 200 of the second structure 20. The first bump structure 100 of the first structure 10 and the second bump structure 200 of the second structure 20 may or may not be the same size.

Figure 5D:
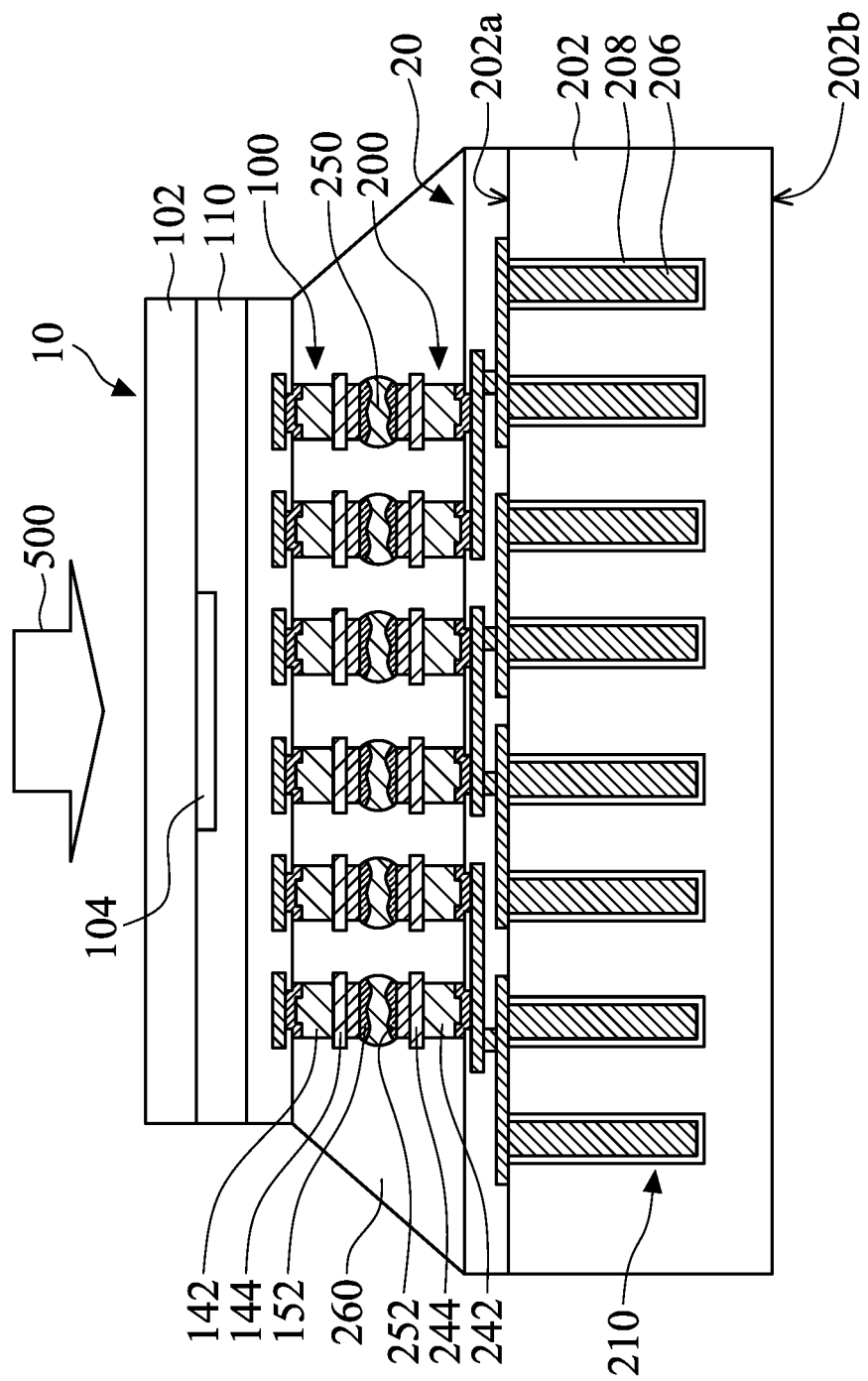

Subsequently, as shown in FIG. 5D, during the reflow process 500, the first solder layer 148 and the second solder layer 248 are melted and reshaped to form the solder joint 250, in accordance with some embodiments of the disclosure. The first IMC 152 is formed between the first cap layer 146 and the solder joint 250, and the second IMC 252 is formed between the second cap layer 246 and the solder joint 250. In some embodiments, the first IMC 152 and the second IMC 252 independently include $Cu_6Sn_5$. In some embodiments, the first IMC 152 and the second IMC 252 are separated from each other by the solder joint 250. In some other embodiments, the first IMC 152 and the second IMC 252 independently include $Ni_3Sn_4$, $AuSn_4$ or another suitable material.

The interface between the first IMC 152 and the solder joint 250 or between the second IMC 252 and the solder joint 250 may be irregular. In some other embodiments, the interface can be observed using an electron microscope, such as a scanning electron microscope (SEM), and/or spectroscopy technology, such as an energy-dispersive X-ray spectroscopy (EDS, EDX or XEDS).

Afterwards, an underfill layer 260 is formed between the first structure 10 and the second structure 20. The first bump structure 100, the solder joint 250, the first IMC 152, the second IMC 252 and the second structure 200 are embedded in and protected by the underfill layer 260.

In some embodiments, the underfill layer 260 includes liquid epoxy, deformable gel, silicon rubber, another suitable material, or a combination thereof. In some embodiments, the underfill layer 260 includes an epoxy-based resin with fillers dispersed therein. The fillers may include insulating fibers, insulating particles, other suitable elements, or a combination thereof. In some embodiments, a dispensing and curing process is performed to form the underfill layer 260.

Figure 5E:
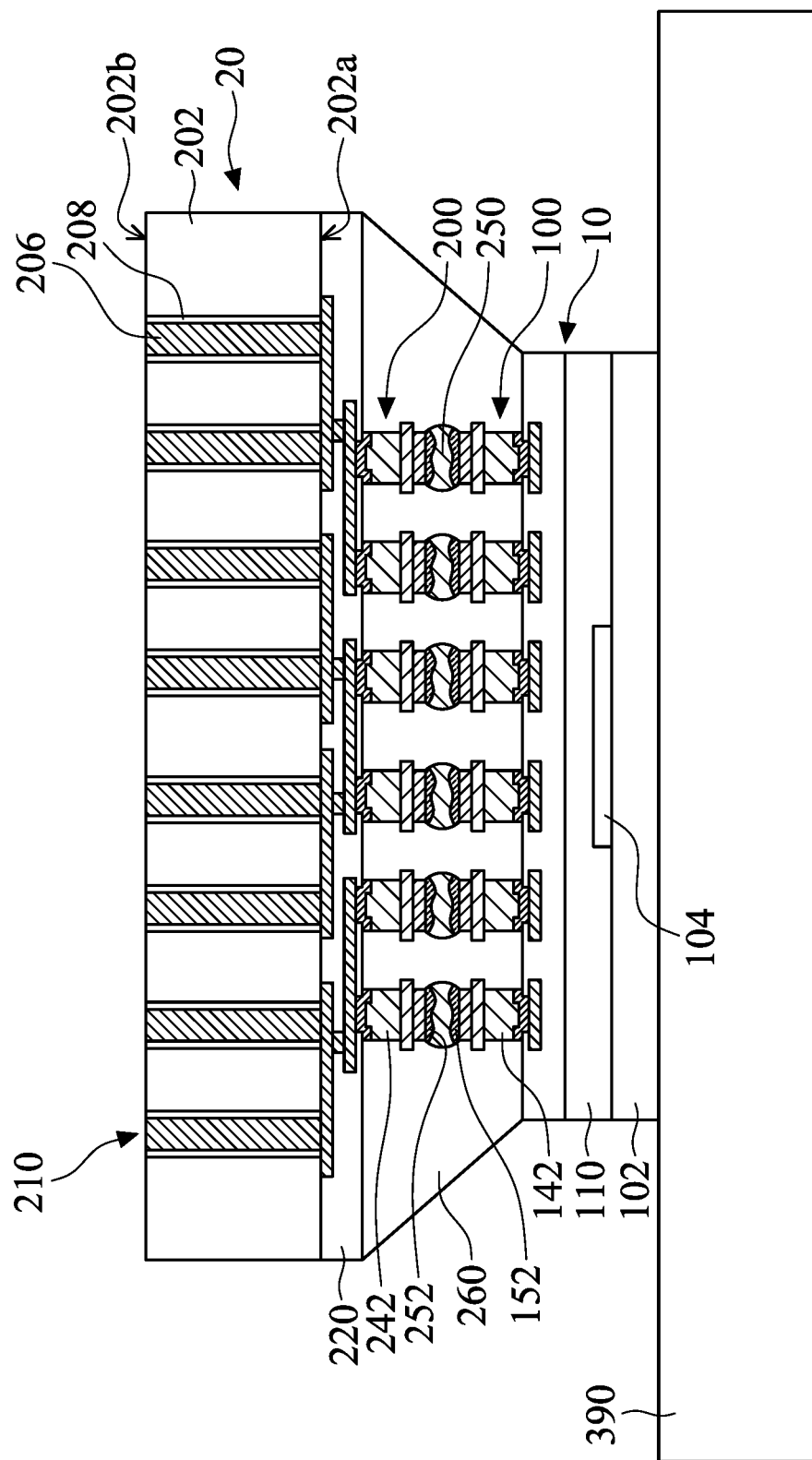

Subsequently, as shown in FIG. 5E, the first structure 10 and the second structure 20, which are bonded together, are turned upside down and placed over a carrier substrate 390, in accordance with some embodiments of the disclosure.

In some embodiments, the carrier substrate 390 is used as a temporary substrate. The temporary substrate provides mechanical and structural support during subsequent processing steps, such as those described in more detail later. The carrier substrate 390 is made of a semiconductor material, ceramic material, polymer material, metal material, another suitable material, or a combination thereof. In some embodiments, the carrier substrate 390 is a glass substrate. In some other embodiments, the carrier substrate 390 is a semiconductor substrate, such as a silicon wafer.

In some embodiments, the first structure 10 is attached to the carrier substrate 390 through an adhesive layer (not shown). The adhesive layer is used as a temporary adhesive layer. The adhesive layer may be glue or a tape. In some embodiments, the adhesive layer is photosensitive and is easily detached from the carrier substrate 390 by light irradiation. For example, shining ultra-violet (UV) light or laser light on the carrier substrate 390 is used to detach the adhesive layer. In some embodiments, the adhesive layer is a light-to-heat-conversion (LTHC) coating. In some other embodiments, the adhesive layer is heat-sensitive and is easily detached from the carrier substrate 390 when it is exposed to heat.

Figure 5F:
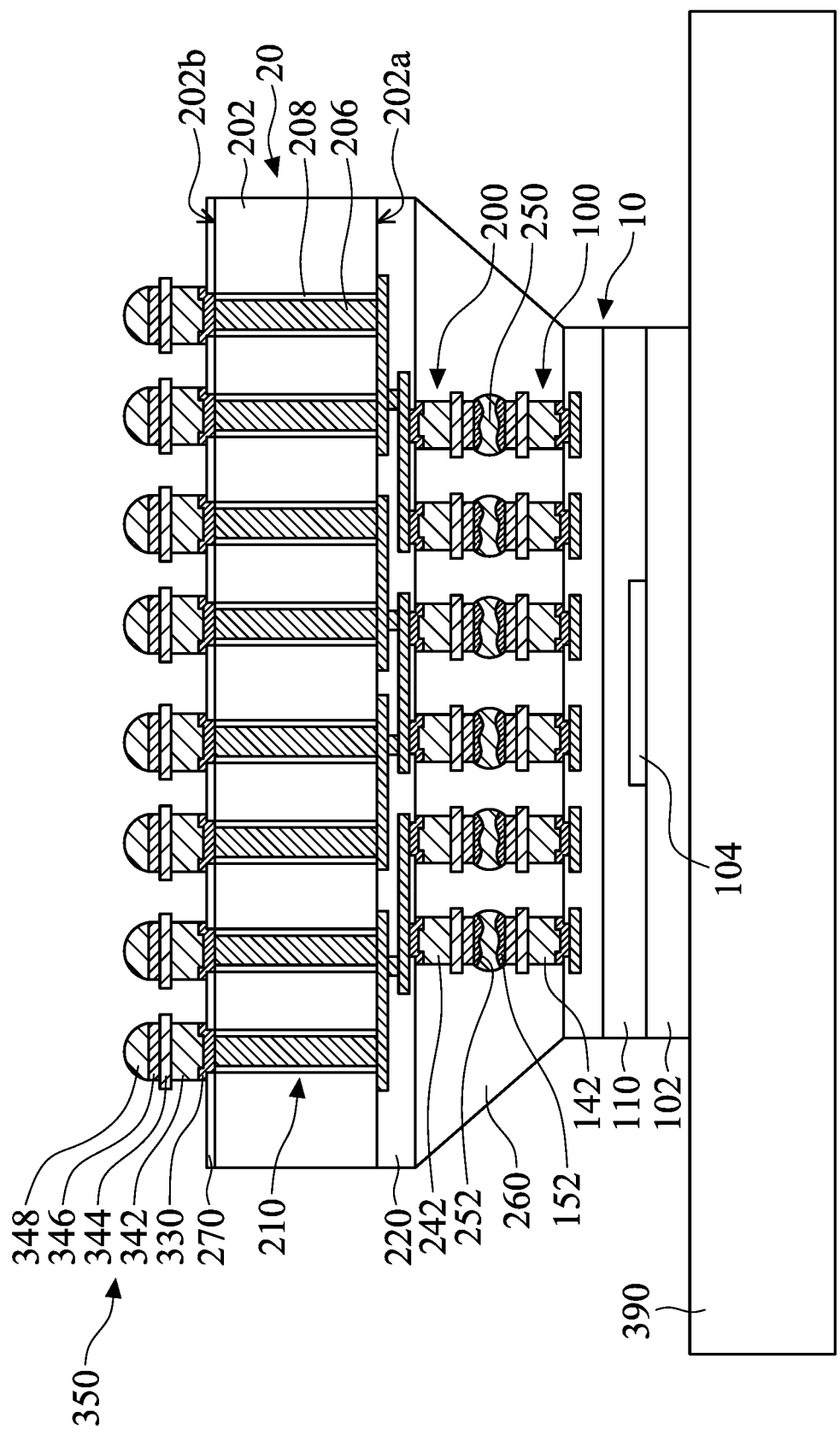

Next, as shown in FIG. 5F, the first substrate 202 of the first structure 10 is thinned using the carrier substrate 390 as a support, in accordance with some embodiments of the disclosure. In some embodiments, the first substrate 202 is thinned from the second surface 202b until the TSVs 210 are exposed. In some embodiments, the first substrate 202 is thinned by a planarization process. The planarization process may include a chemical mechanical polishing (CMP) process, a grinding process, an etching process, another applicable process, or a combination thereof.

Afterwards, a passivation layer 270 is formed over the second substrate 202, and the passivation layer 270 is patterned to form a number of openings. The openings expose portions of the conductive structure 206 of the TSVs 210. The passivation layer 270 is made of dielectric material(s) and provides stress relief for bonding stress incurred during subsequent bonding processes. In some embodiments, the passivation layer 270 is made of PBO, BCB, silicone, acrylates, siloxane, another suitable material, or a combination thereof. In some other embodiments, the passivation layer 270 is made of non-organic materials. The non-organic materials include silicon oxide, un-doped silicate glass, silicon oxynitride, silicon nitride, silicon carbide, HMDS, another suitable material, or a combination thereof.

Next, a number of connectors 350 are formed over the passivation layer 270. The connectors 350 are electrically connected to the TSVs 210. In some embodiments, the connectors 350 are referred to as controlled collapse chip connection (C4) bumps. Each of the connectors 350 includes a third UBM layer 330, a third pillar layer 342, a third barrier layer 344, a third cap layer 346 and a third solder layer 348.

Figure 5G:
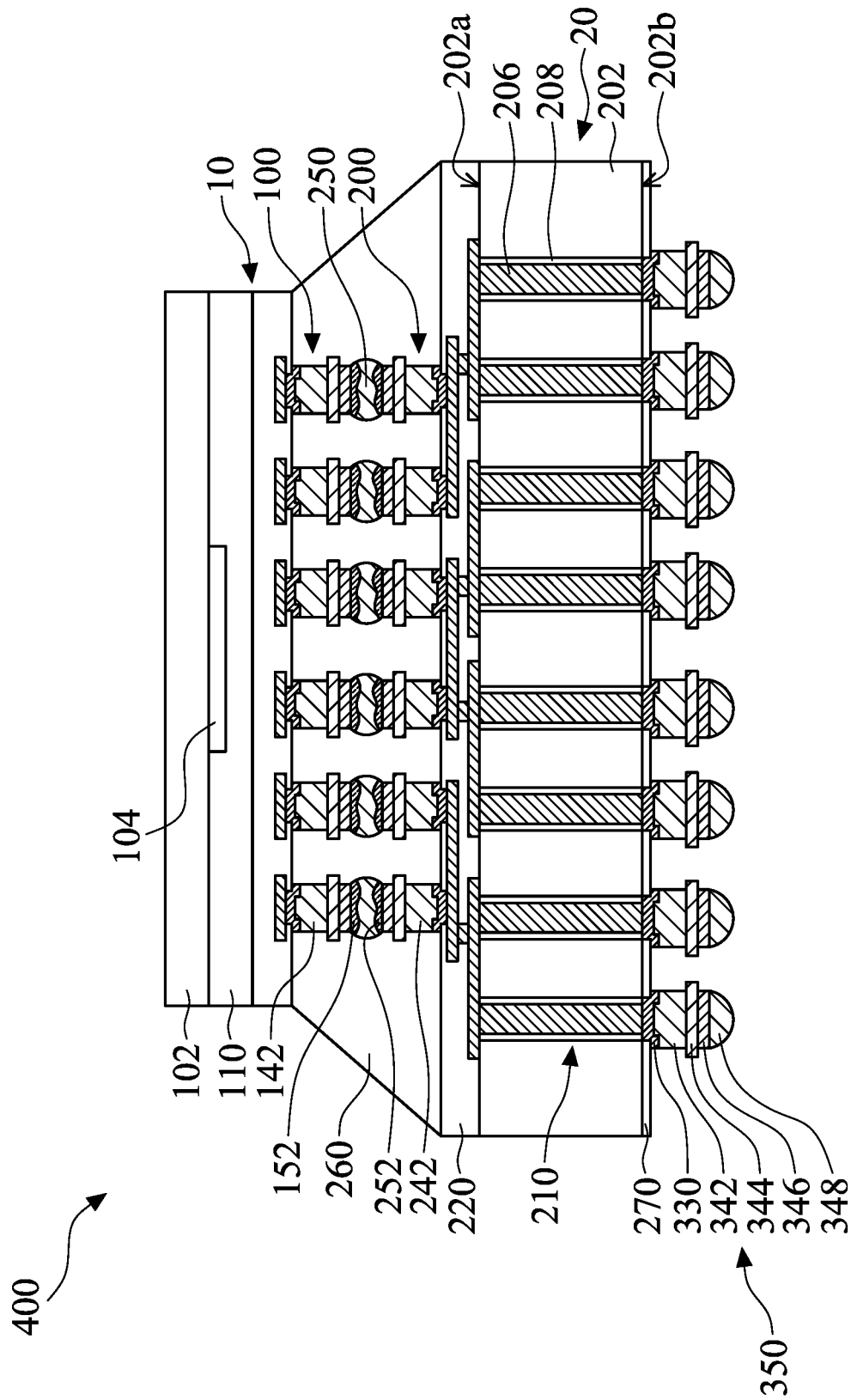

Afterwards, as shown in FIG. 5G, the carrier substrate 390 is removed, in accordance with some embodiments of the disclosure. In some embodiments, suitable light is provided to detach the adhesive layer and lift off the carrier substrate 390.

Subsequently, a singulation process is performed to separate the wafer-level package structure 300 into multiple die-level sub-package structures 400. One of the sub-package structures 400 is shown in FIG. 5G. In some embodiments, the singulation process is a dicing process.

Figure 5H:
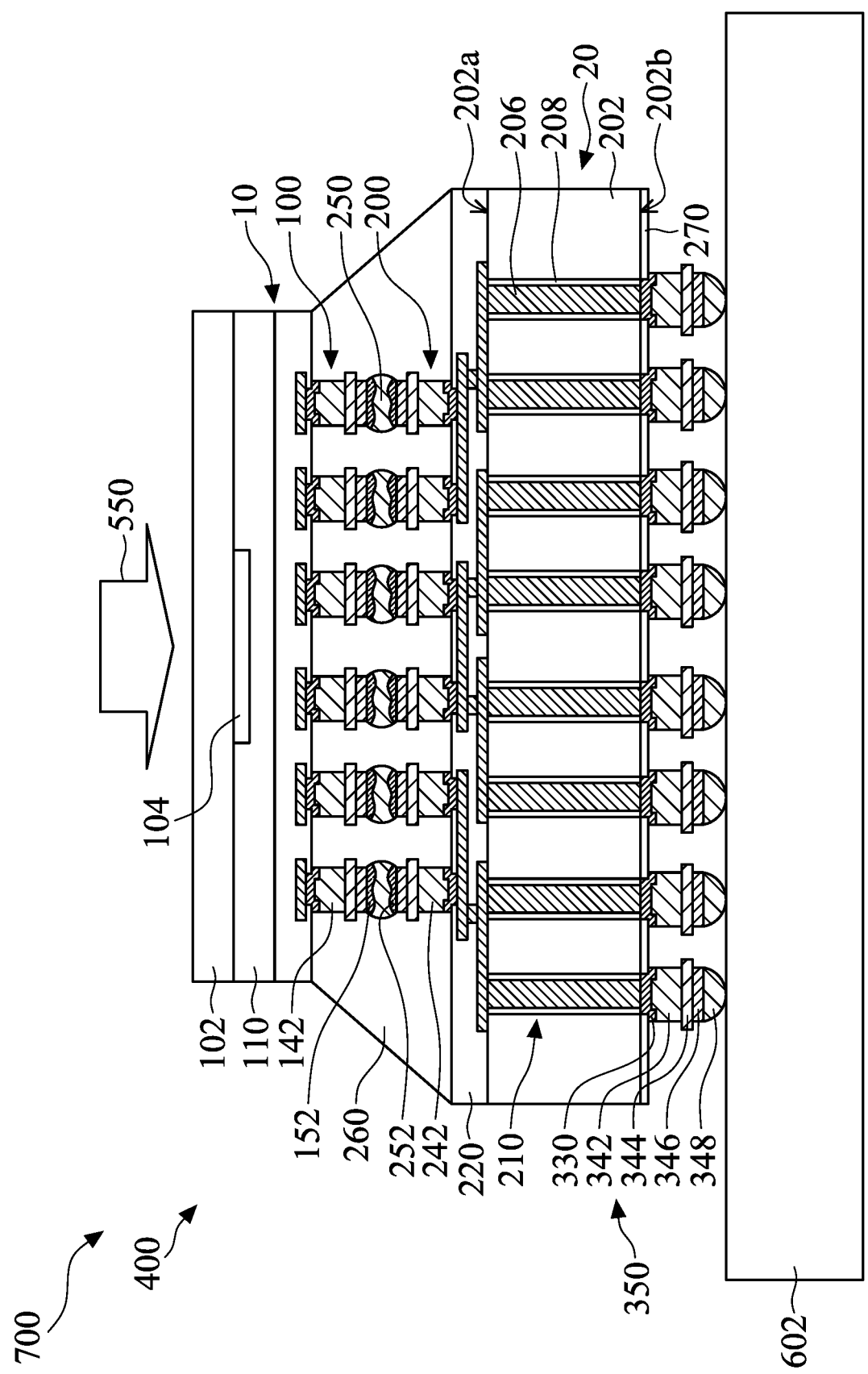

Afterwards, as shown in FIG. 5H, the sub-package structure 400 is bonded to a third substrate 602 through the connectors 350, in accordance with some embodiments of the disclosure. In some embodiments, the third substrate 602 is a printed circuit board (PCB), a ceramic substrate or another suitable package substrate. Next, a reflow process 550 is performed on the sub-package structures 400 and the third substrate 602 to form a package structure 700.

Figure 5I:
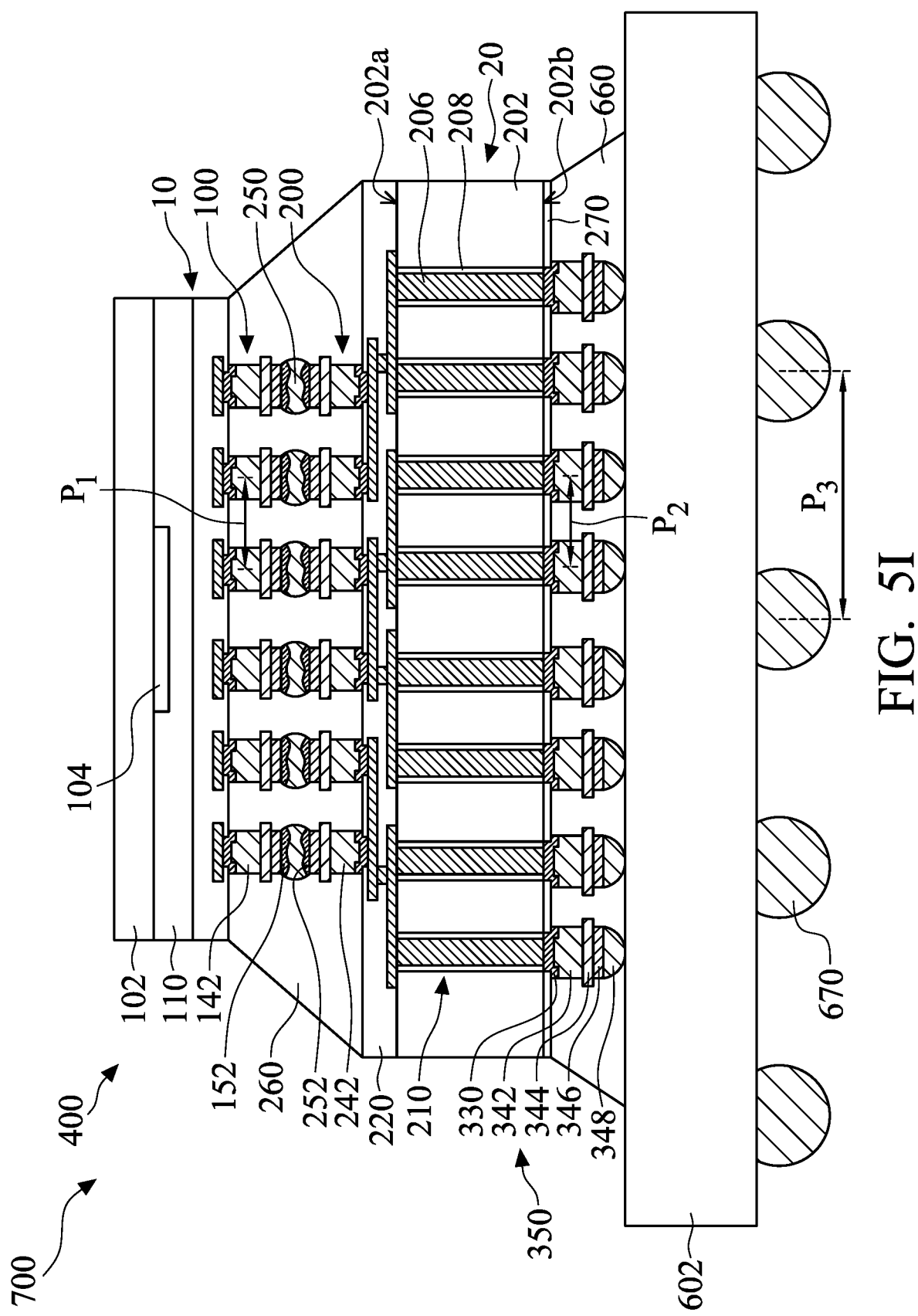

Afterwards, as shown in FIG. 5I, an underfill layer 660 is formed between the sub-package structures 400 and the third substrate 602, in accordance with some embodiments of the disclosure. As a result, the connectors 350 are embedded in and protected by the underfill layer 660. Next, a number of connectors 670 are formed on a bottom surface of the third substrate 602. The connectors 670 are electrically connected to the connectors 350 and the sub-package 400.

As shown in FIG. 5I, a first pitch $P_1$ is between two adjacent first pillar layers 142, a second pitch $P_2$ is between two adjacent third pillar layers 342, and a third pitch $P_3$ is between two adjacent connectors 670. In some embodiments, the first pitch $P_1$ is in a range from about 30 μm to about 60 μm. In some embodiments, the second pitch $P_2$ is in a range from about 100 μm to about 300 μm. In some embodiments, the third pitch $P_3$ is in a range from about 800 μm to about 1000 μm.

Figure 5J:
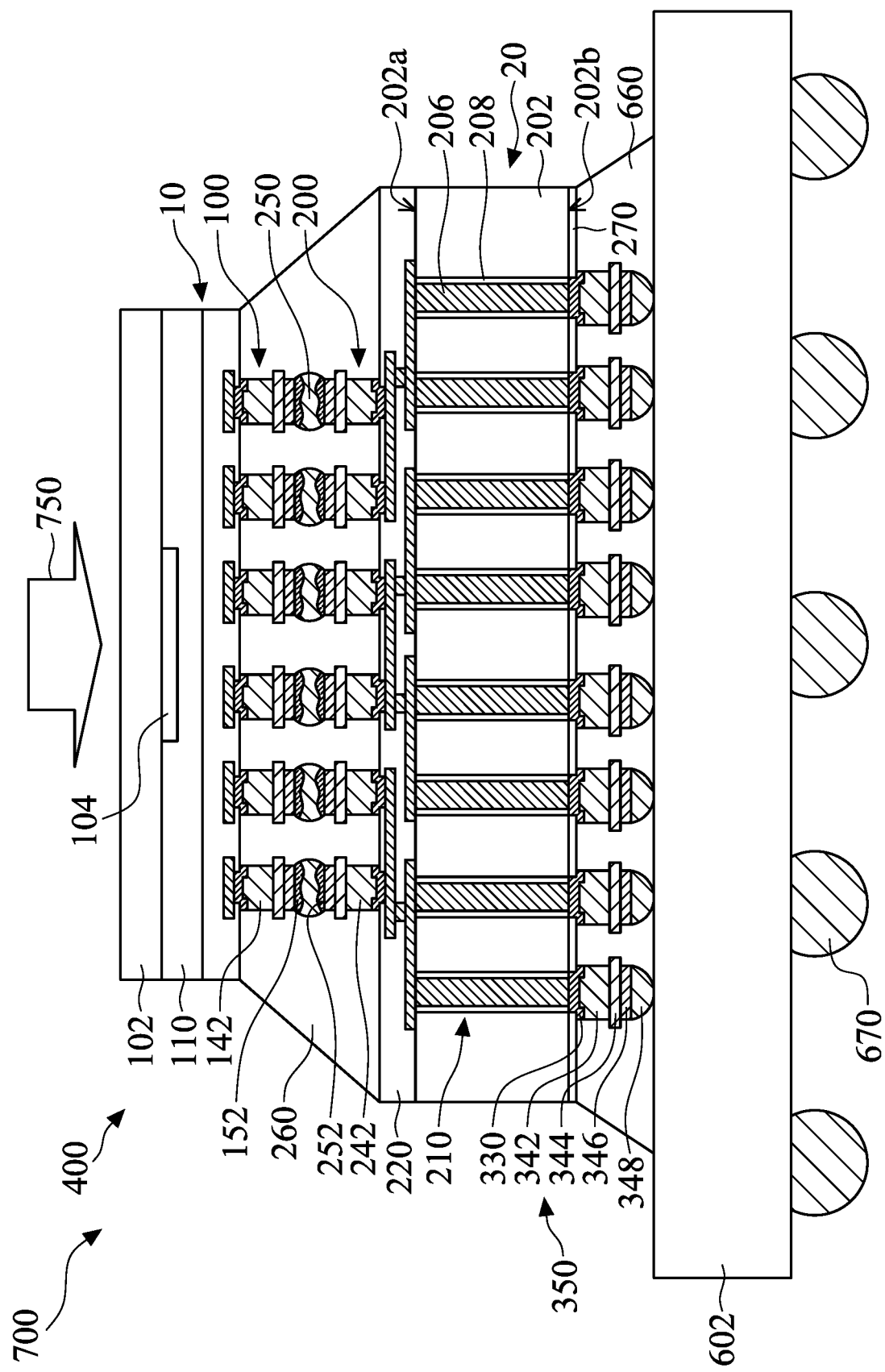

Subsequently, as shown in FIG. 5J, a test 750 is performed on the package structure 700, in accordance with some embodiments of the disclosure.

In some embodiments, the test 750 is a high-temperature storage (HTS) test, a temperature cycling test (TCT), or another suitable qualification test. The HTS test may be complied with JEDEC (Joint Electron Device Engineering Council) standards. In some embodiments, the test 750 is performed at about 150 degrees Celsius, but embodiments of the disclosure are not limited thereto. In some embodiments, the operation time of the test 750 is in a range from about 1000 hours to about 3000 hours. For example, the operation time of the test 750 may be about 1500 hours. However, embodiments of the disclosure are not limited thereto.

It should be noted that the first solder layer 148 and the second solder layer 248 may flow or migrate as the using time of the package structure 700 is increased. If no protruding first barrier layer 144 is formed, the first solder layer 148 may flow downward to make contact with the first pillar layer 142 causing a short-circuit. In order to prevent short-circuits, the first barrier layer 144 and the second barrier layer 244 are designed to have a wider width to provide a barrier wall.

The package structure includes the first bump structure bonded to the second bump structure. The first barrier layer has the protruding portion to block portions of the first solder layer which may flow when the using time of the package structure is increased. In other words, the first barrier layer is used to prevent the first solder layer from contacting the first pillar layer.

Embodiments for forming a package structure and method for forming the same are provided. A first package structure including a first bump structure is bonded to a second package structure including a second bump structure. The first bump structure includes a first pillar layer, a first barrier layer over the first pillar layer. The first barrier layer has a protruding portion which extends away from the sidewall surface of the first pillar layer. The second bump structure is similar to the second bump structure and has a second barrier layer. The first bump structure is boned to the second bump structure to form a first IMC, a solder joint and a second IMC. The first barrier layer has a wider width to prevent the first solder layer from contacting the first pillar layer. Therefore, the performance and reliability of the package structure is improved.

In some embodiments, a package structure is provided. The package structure includes a first bump structure formed over a substrate, a solder joint formed over the first bump structure and a second bump structure formed over the solder joint. The first bump structure includes a first pillar layer formed over the substrate and a first barrier layer formed over the first pillar layer. The first barrier layer has a protruding portion which extends away from a sidewall surface of the first pillar layer, and a distance between the sidewall surface of the first pillar layer and a sidewall surface of the first barrier layer is in a range from about 0.5 μm to about 3 μm. The second bump structure includes a second barrier layer formed over the solder joint and a second pillar layer formed over the second barrier layer. The second barrier layer has a protruding portion which extends away from a sidewall surface of the second pillar layer.

In some embodiments, a package structure is provided. The package structure includes a first structure formed over a first substrate. The first structure includes a first bump structure, the first bump structure includes a first pillar layer formed over the first substrate, and the first pillar layer has a first width in a horizontal direction. The first bump structure further includes a first barrier layer formed over the first pillar layer, and the first barrier layer has a second width in the horizontal direction, and the second width is greater than the first width. The first bump structure further includes a first cap layer formed over the first barrier layer, the first cap layer has a third width in the horizontal direction, and the second width is greater than the third width. The package structure also includes a first inter intermetallic compound (IMC) over the first bump structure, and a portion of a top surface of the first barrier layer is covered by the first IMC. A sidewall surface of the first pillar layer is free of first IMC. The package structure further includes a solder joint formed over the first IMC and a second structure formed over the solder joint.

In some embodiments, a method for forming a package structure is provided. The method includes forming an under bump metallization (UBM) layer over a metal pad and forming a photoresist layer over the UBM layer. The method also includes patterning the photoresist layer to form an opening in the photoresist layer, and a first portion of the UBM layer is exposed by the opening. The method further includes forming a first bump structure over the first portion of the UBM layer. The first bump structure includes a first barrier layer over a first pillar layer, and a width of the first barrier layer is greater than a width of the first pillar layer. The method also includes placing a second bump structure over the first bump structure, and the second bump structure includes a second barrier layer over a second pillar layer, and a width of the second barrier layer is greater than a width of the second pillar layer. The method further includes reflowing the first bump structure and the second bump structure to form a solder joint, a first inter intermetallic compound (IMC) and a second IMC, and the solder joint is between the first IMC and the second IMC.

In some embodiments, forming the first bump structure over the first portion of the UBM layer includes: forming the first pillar layer in the opening over the first portion of the UBM layer; forming the first barrier layer over the first pillar layer; forming a solder layer over the first barrier layer; removing the patterned photoresist layer to expose a second portion of the UBM layer; and removing the second portion of the UBM layer, a portion of the first pillar layer and a portion of the solder layer, such that the first barrier layer has a protruding portion which extends away from a sidewall surface of the first pillar layer.

In some embodiments, the method further includes: forming a first cap layer over the first barrier layer, and removing a portion of the first cap layer while removing the second portion of the UBM layer, the portion of the first pillar layer and the portion of the solder layer.

In some embodiments, forming the first bump structure further includes forming an interface between the first cap layer and the first barrier layer, and the interface is a planar surface, a concave surface or a convex surface.

In some embodiments, a width of the solder layer is greater than a width of the first cap layer after the portion of the first cap layer is removed.

In some embodiments, reflowing the first bump structure and the second bump structure further includes forming a first portion of the solder joint over the first IMC and a second portion of the solder joint adjacent to the first cap layer. The first portion and the second portion are separated by the first IMC.

In some embodiments, forming the solder joint further includes making the solder joint free of a top surface of the first barrier layer.

In some embodiments, a method for forming a package structure is provided. The method includes forming a first structure over a first substrate. Forming the first structure includes forming a first bump structure, and forming the first bump structure includes: forming a first pillar layer over the first substrate; forming a first barrier layer over the first pillar layer; and forming a first cap layer over the first barrier layer. The method also includes placing a second structure over the first bump structure. The second structure includes a second bump structure. The method further includes reflowing the first bump structure and the second bump structure to form a solder joint and a first inter intermetallic compound (IMC). The first IMC is formed over the first cap layer. The solder joint includes a first portion formed over the first IMC and a second portion adjacent to the first cap layer on the top surface of the first barrier layer. The first portion and the second portion are separated by the first IMC.

In some embodiments, reflowing the first bump structure and the second structure further includes forming a second IMC, the second IMC is closer to the second bump structure than the first IMC.

In some embodiments, forming the first bump structure further includes: forming the first pillar layer with a first width in a horizontal direction; and forming the first barrier layer with a second width in the horizontal direction. The second width is greater than the first width.

In some embodiments, forming the first bump structure further includes: forming the first cap layer with a third width in the horizontal direction. The second width is greater than the third width.

In some embodiments, the method further includes providing a plurality of through-substrate-vias (TSV) formed in a second substrate. The TSVs are electrically connected to the second bump structure.

In some embodiments, the method further includes forming a plurality of connectors over the second structure. The connectors are electrically connected to the TSVs. The method further includes forming au underfill layer. The connectors are embedded in the underfill layer.

In some embodiments, forming the first bump structure further includes: forming the first pillar layer with a first height in a vertical direction; forming the first barrier layer with a second height in the vertical direction; and forming the first cap layer with a third height in the vertical direction. The first height is greater than the second height and the third height.

In some embodiments, a method for forming a package structure is provided. The method includes forming a first structure over a first substrate. Forming the first structure includes forming a first bump structure, and forming the first bump structure includes: forming a first pillar layer over the first substrate. The first pillar layer has a first width in a horizontal direction; and forming a first barrier layer over the first pillar layer. The first barrier layer has a second width in the horizontal direction, and the second width is greater than the first width. The method further includes placing a second structure over the first bump structure. The second structure includes a second bump structure. The method also includes reflowing the first bump structure and the second bump structure to form a solder joint. The solder joint is formed to be electrically connected to the first bump structure and the second structure, and a top surface of the first barrier layer without vertically overlapping the first pillar layer is free of the solder joint.

In some embodiments, forming the second bump structure further includes: forming a second pillar layer formed over a second substrate. The second pillar layer has a third width in the horizontal direction. The method also includes forming a second barrier layer formed over the second pillar layer. The second barrier layer has a fourth width in the horizontal direction, and the fourth width is greater than the third width.

In some embodiments, reflowing the first bump structure and the second bump structure further comprising forming a first inter intermetallic compound (IMC) over the first bump structure, and a width of the first IMC is less than the second width of the first barrier layer in the horizontal direction.

In some embodiments, forming the first bump structure further includes: forming an interface between the first pillar layer and the first barrier layer, and the interface is a planar surface, a concave surface or a convex surface.

In some embodiments, forming the first bump structure further includes: forming a first solder layer over the first barrier layer; removing a portion of the first solder layer; and reflowing the first solder layer. A width of the reflowed first solder layer is substantially equal to the second width of the first barrier layer in the horizontal direction.

In some embodiments, forming the first bump structure further includes: forming a first cap layer over the first barrier layer; and removing a portion of the first cap layer while removing a portion of the first pillar layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
forming an under bump metallization (UBM) layer over a metal pad;

forming a photoresist layer over the UBM layer;
patterning the photoresist layer to form an opening in the photoresist layer, wherein a first portion of the UBM layer is exposed by the opening;
forming a first bump structure over the first portion of the UBM layer, wherein the first bump structure comprises a first barrier layer over a first pillar layer, and a width of the first barrier layer is greater than a width of the first pillar layer, wherein the first bump structure comprises a first solder layer over a first barrier layer, and a width of an interface between the first solder layer and the first barrier layer is less than a width of a top surface of the first barrier layer;
placing a second bump structure over the first bump structure, wherein the second bump structure comprises a second barrier layer over a second pillar layer, and a width of the second barrier layer is greater than a width of the second pillar layer; and
reflowing the first bump structure and the second bump structure to form a solder joint, a first inter intermetallic compound (IMC) and a second IMC, wherein the solder joint is between the first IMC and the second IMC.

2. The method for forming the package structure as claimed in claim 1, wherein forming the first bump structure over the first portion of the UBM layer comprises:
forming the first pillar layer in the opening over the first portion of the UBM layer;
forming the first barrier layer over the first pillar layer;
forming a solder layer over the first barrier layer;
removing the patterned photoresist layer to expose a second portion of the UBM layer; and
removing the second portion of the UBM layer, a portion of the first pillar layer and a portion of the solder layer, such that the first barrier layer has a protruding portion which extends away from a sidewall surface of the first pillar layer.

3. The method for forming the package structure as claimed in claim 2, further comprising:
forming a first cap layer over the first barrier layer; and
removing a portion of the first cap layer while removing the second portion of the UBM layer, the portion of the first pillar layer and the portion of the solder layer.

4. The method for forming the package structure as claimed in claim 3, wherein forming the first bump structure further comprises forming an interface between the first cap layer and the first barrier layer, and the interface is a planar surface, a concave surface or a convex surface.

5. The method for forming the package structure as claimed in claim 3, wherein a width of the solder layer is greater than a width of the first cap layer after the portion of the first cap layer is removed.

6. The method for forming the package structure as claimed in claim 3, wherein reflowing the first bump structure and the second bump structure further comprises forming a first portion of the solder joint over the first IMC and a second portion of the solder joint adjacent to the first cap layer, wherein the first portion and the second portion are separated by the first IMC.

7. The method for forming the package structure as claimed in claim 1, wherein forming the solder joint further comprises making the solder joint free of a top surface of the first barrier layer.

8. A method for forming a package structure, comprising:
forming a first structure over a first substrate, wherein forming the first structure comprises forming a first bump structure, and forming the first bump structure comprises:
forming a first pillar layer over the first substrate;
forming a first barrier layer over the first pillar layer;
forming a first cap layer over the first barrier layer;
forming a first solder layer over the first cap layer; and
reflowing the first solder layer, wherein after the reflowing the first solder layer, a height of the first solder layer is increased;
placing a second structure over the first bump structure, wherein the second structure comprises a second bump structure; and
reflowing the first bump structure and the second bump structure to form a solder joint and a first inter intermetallic compound (IMC), wherein the first IMC is formed over the first cap layer,
wherein the solder joint comprises a first portion formed over the first IMC and a second portion adjacent to the first cap layer on the top surface of the first barrier layer, wherein the first portion and the second portion are separated by the first IMC.

9. The method for forming the package structure as claimed in claim 8, wherein reflowing the first bump structure and the second structure further comprises forming a second IMC, the second IMC is closer to the second bump structure than the first IMC.

10. The method for forming the package structure as claimed in claim 8, wherein forming the first bump structure further comprises:
forming the first pillar layer with a first width in a horizontal direction; and
forming the first barrier layer with a second width in the horizontal direction, wherein the second width is greater than the first width.

11. The method for forming the package structure as claimed in claim 10, wherein forming the first bump structure further comprises:
forming the first cap layer with a third width in the horizontal direction, wherein the second width is greater than the third width.

12. The method for forming the package structure as claimed in claim 8, further comprising providing a plurality of through-substrate-vias (TSV) formed in a second substrate, wherein the TSVs are electrically connected to the second bump structure.

13. The method for forming the package structure as claimed in claim 12, further comprising:
forming a plurality of connectors over the second structure, wherein the connectors are electrically connected to the TSVs; and
forming au underfill layer, wherein the connectors are embedded in the underfill layer.

14. The method for forming the package structure as claimed in claim 8, wherein forming the first bump structure further comprises:
forming the first pillar layer with a first height in a vertical direction;
forming the first barrier layer with a second height in the vertical direction; and
forming the first cap layer with a third height in the vertical direction, wherein the first height is greater than the second height and the third height.

15. A method for forming a package structure, comprising:
forming a first structure over a first substrate, wherein forming the first structure comprises forming a first bump structure, and forming the first bump structure comprises:
forming a first pillar layer over the first substrate, wherein the first pillar layer has a first width in a horizontal direction;
forming a first barrier layer over the first pillar layer, wherein the first barrier layer has a second width in the horizontal direction, and the second width is greater than the first width;
forming a first solder layer over the first barrier layer;
removing a portion of the first solder layer; and
reflowing the first solder layer, wherein a width of the reflowed first solder layer is substantially equal to the second width of the first barrier layer in the horizontal direction;
placing a second structure over the first bump structure, wherein the second structure comprises a second bump structure; and
reflowing the first bump structure and the second bump structure to form a solder joint, wherein the solder joint is formed to be electrically connected to the first bump structure and the second structure, and a top surface of the first barrier layer without vertically overlapping the first pillar layer is free of the solder joint.

16. The method for forming the package structure as claimed in claim 15, wherein forming the second bump structure further comprises:
forming a second pillar layer formed over a second substrate, wherein the second pillar layer has a third width in the horizontal direction; and
forming a second barrier layer formed over the second pillar layer, wherein the second barrier layer has a fourth width in the horizontal direction, and the fourth width is greater than the third width.

17. The method for forming the package structure as claimed in claim 15, wherein reflowing the first bump structure and the second bump structure further comprising forming a first inter intermetallic compound (IMC) over the first bump structure, and a width of the first IMC is less than the second width of the first barrier layer in the horizontal direction.

18. The method for forming the package structure as claimed in claim 15, wherein forming the first bump structure further comprises: forming an interface between the first pillar layer and the first barrier layer, and the interface is a planar surface, a concave surface or a convex surface.

19. The method for forming the package structure as claimed in claim 15, wherein forming the first bump structure further comprises:
forming a first cap layer over the first barrier layer; and
removing a portion of the first cap layer while removing a portion of the first pillar layer.

20. The method for forming the package structure as claimed in claim 8, wherein the first solder layer has a concave top surface.

* * * * *